United States Patent [19]

Fontana et al.

[11] Patent Number: 5,707,884
[45] Date of Patent: Jan. 13, 1998

[54] PROCESS FOR FABRICATING A CONTACTLESS ELECTRICAL ERASABLE EPROM MEMORY DEVICE

[75] Inventors: Gabriella Fontana, Vimercate; Orio Bellezza, Curno; Giuseppe Paolo Crisenza, Trezzo sull'Adda, all of Italy

[73] Assignee: SGS-Thomson Microelectronics, S.r.l., Agrate Brianza, Italy

[21] Appl. No.: 458,059

[22] Filed: Jun. 1, 1995

Related U.S. Application Data

[62] Division of Ser. No. 70,084, May 28, 1993.

[30] Foreign Application Priority Data

Jun. 1, 1992 [EP] European Pat. Off. ............. 92830282

[51] Int. Cl.⁶ .................................................. H01L 21/8247
[52] U.S. Cl. ................................. 437/43; 437/45; 437/200
[58] Field of Search ............................. 437/43, 45, 48, 437/200, 288 PL

[56] References Cited

U.S. PATENT DOCUMENTS

| | | | |
|---|---|---|---|
| 4,519,849 | 5/1985 | Korsh et al. | 437/43 |
| 4,597,060 | 6/1986 | Mitchell et al. | 257/316 |
| 4,780,424 | 10/1988 | Holler | 437/43 |
| 4,892,840 | 1/1990 | Esquivel et al. | 437/48 |
| 4,939,105 | 7/1990 | Langley | 437/228 |
| 4,951,103 | 8/1990 | Esquivel et al. | 257/321 |
| 4,996,668 | 2/1991 | Paterson et al. | 257/321 |
| 5,019,527 | 5/1991 | Ohshima et al. | 437/43 |
| 5,051,796 | 9/1991 | Gill | 257/316 |
| 5,071,782 | 12/1991 | Mori | 437/43 |
| 5,075,245 | 12/1991 | Woo et al. | 437/43 |
| 5,077,230 | 12/1991 | Woo et al. | 437/43 |
| 5,081,056 | 1/1992 | Mazzali et al. | 437/43 |
| 5,087,584 | 2/1992 | Wada et al. | 437/200 |
| 5,102,814 | 4/1992 | Woo | 437/43 |
| 5,110,753 | 5/1992 | Gill et al. | 437/43 |
| 5,111,270 | 5/1992 | Tzeng | 257/322 |
| 5,120,670 | 6/1992 | Bergemont | 437/43 |
| 5,210,046 | 5/1993 | Crotti | 437/43 |
| 5,212,541 | 5/1993 | Bergemont | 257/319 |
| 5,240,870 | 8/1993 | Bergemont | 437/43 |
| 5,346,842 | 9/1994 | Bergemont | 437/200 |

FOREIGN PATENT DOCUMENTS

| | | |
|---|---|---|
| 0-396-508 | 11/1990 | European Pat. Off. . |
| A-4-113-325 | 10/1991 | Germany . |
| 0152673 | 6/1989 | Japan . |

OTHER PUBLICATIONS

Eitan, "Alternate Metal Virtual Ground . . . ," 12 Electron Device Letters, 450ff (Aug. 1991).

U.S. Patent Application 08/070,084, filed on May 28, 1993, Fontanta et al.

*Primary Examiner*—Chandra Chaudhari
*Attorney, Agent, or Firm*—Robert Groover; Betty Formby; Matthew Anderson

[57] ABSTRACT

An improved fabrication process employing relatively non-critical masks permits the fabrication of high density electrically programmable and erasable EEPROM or FLASH-EPROM devices. In practice the novel process permits the fabrication of a contactless, cross-point array providing for a more comfortable "pitch" of bitline metal-definition while realizing a cell layout with a gate structure which extends laterally over adjacent portions of field oxide, thus establishing an appropriate capacitive coupling between control and floating gates. Two alternative embodiments are described.

4 Claims, 35 Drawing Sheets

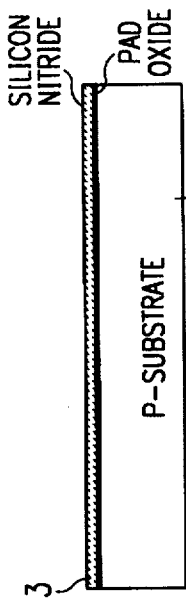
FIG. 1B1
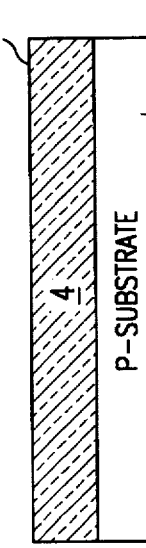
FIG. 1B2
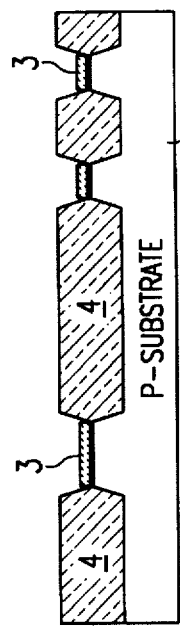
FIG. 1B3
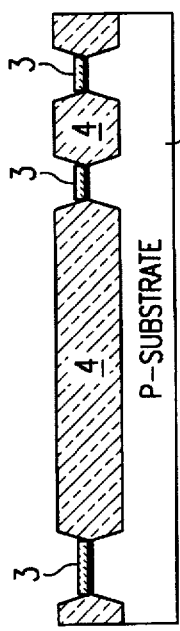
FIG. 1B4
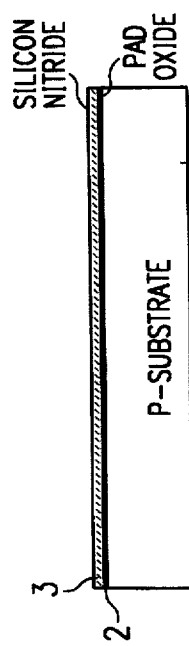
FIG. 1A1
FIG. 1A2
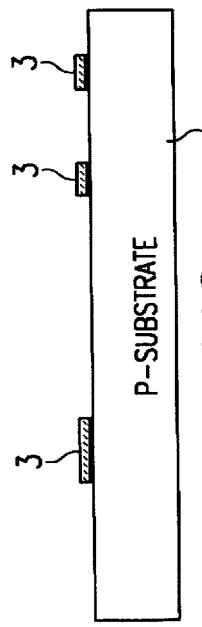
FIG. 1A3
FIG. 1A4

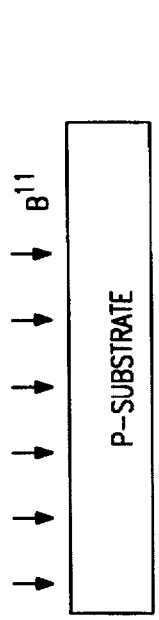
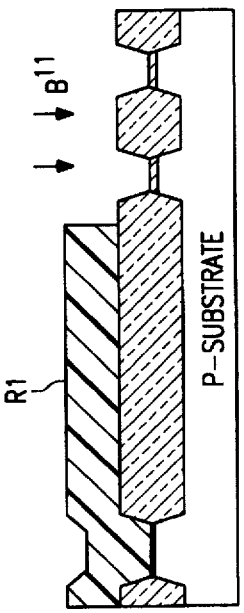
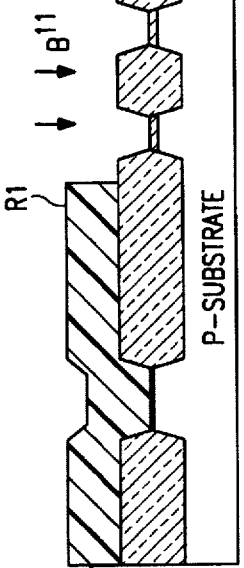
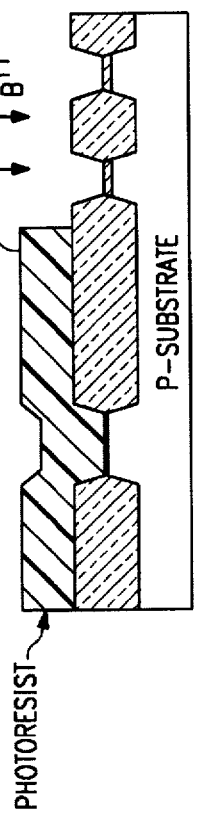
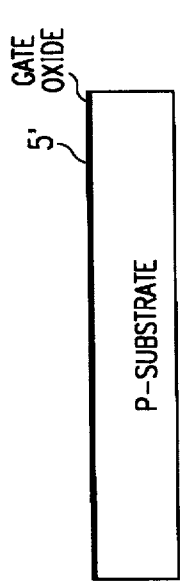
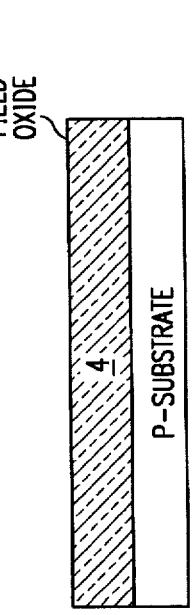
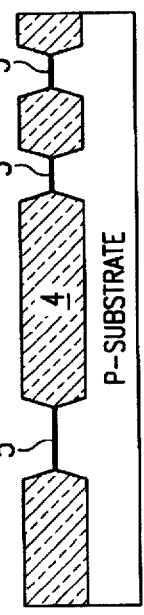

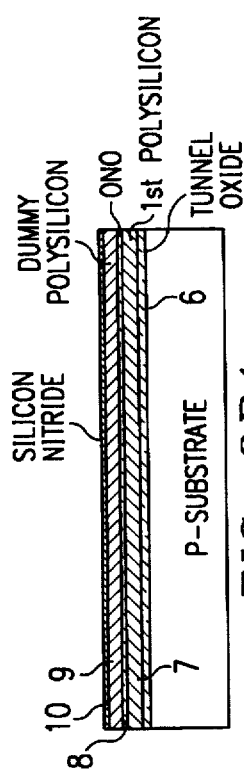
FIG. 3B1
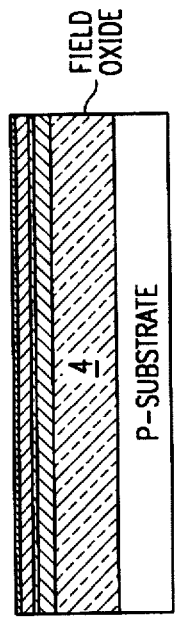
FIG. 3B2
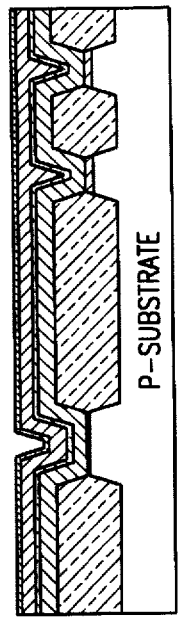
FIG. 3B3
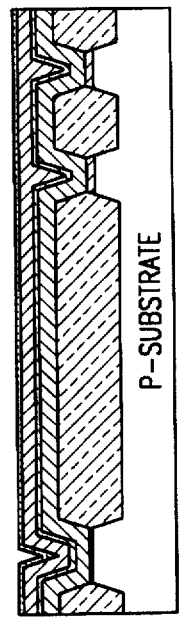
FIG. 3B4
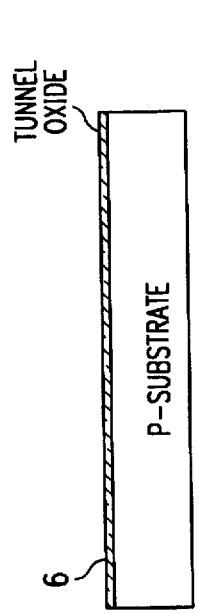
FIG. 3A1
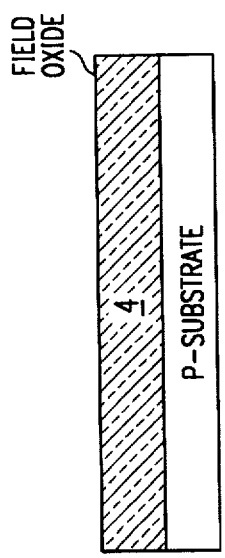
FIG. 3A2
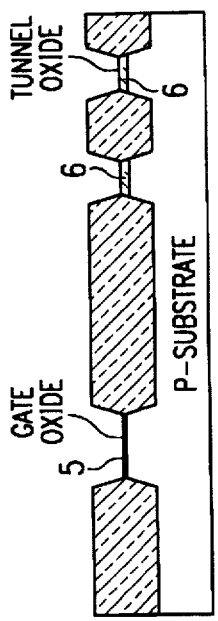
FIG. 3A3
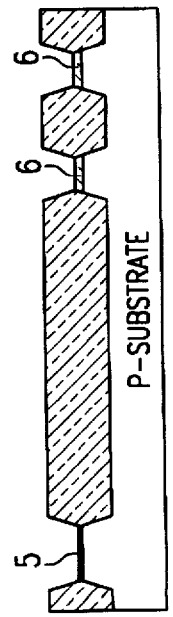
FIG. 3A4

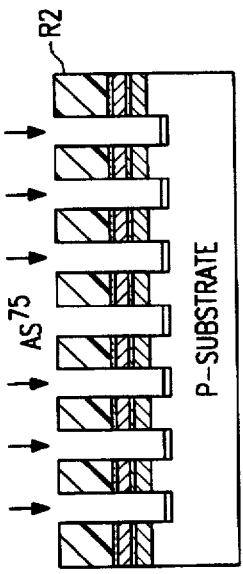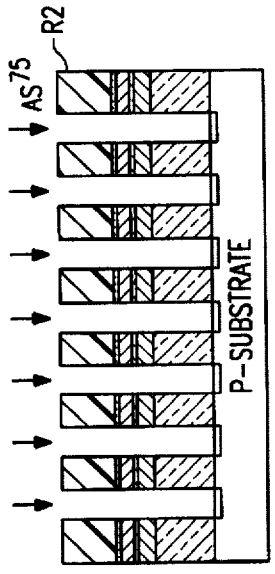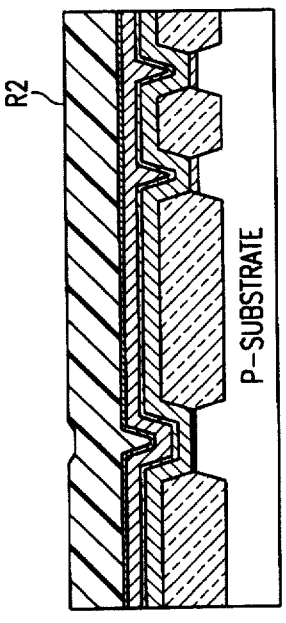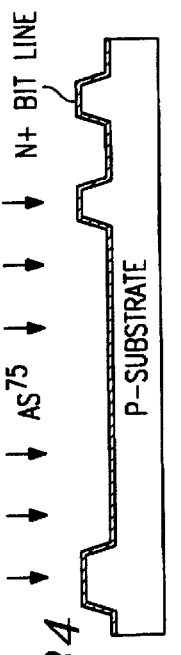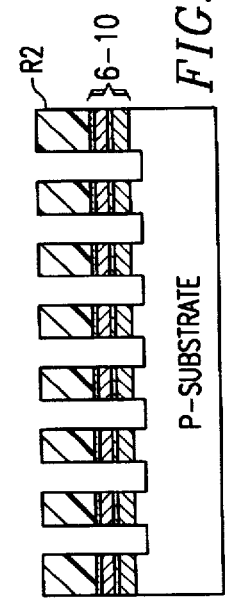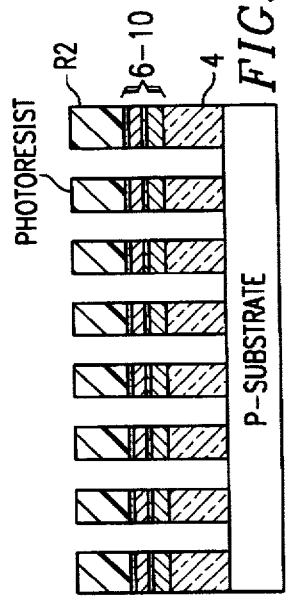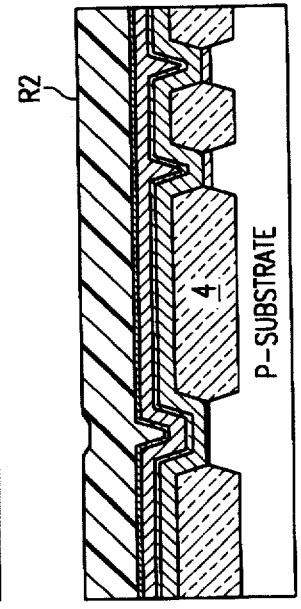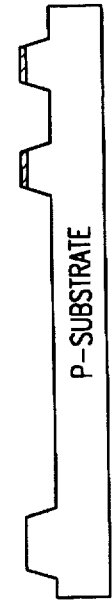

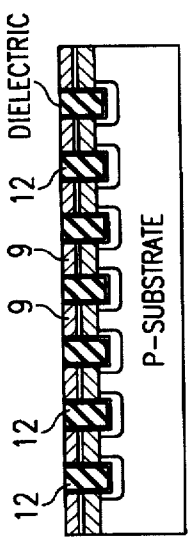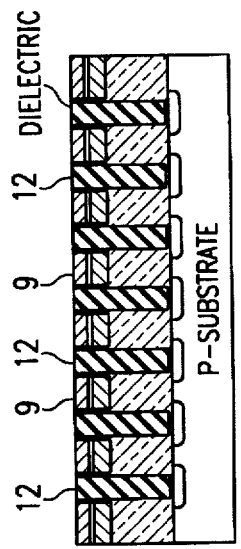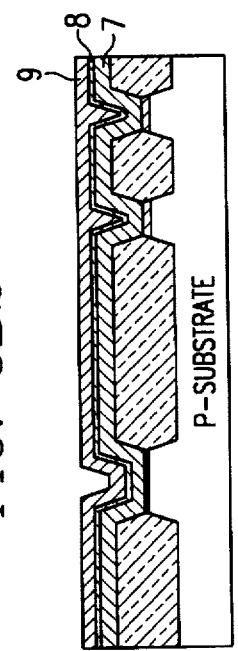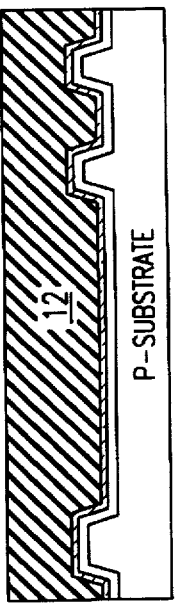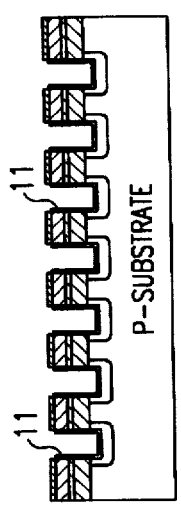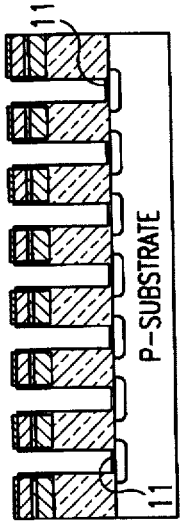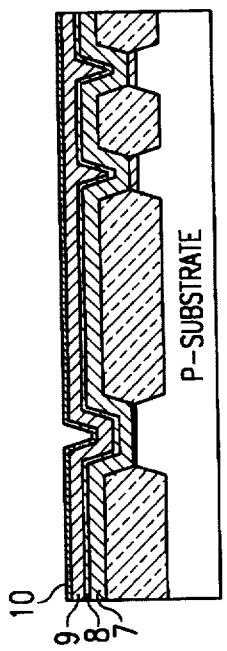

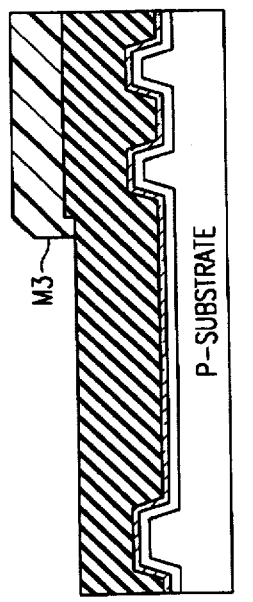
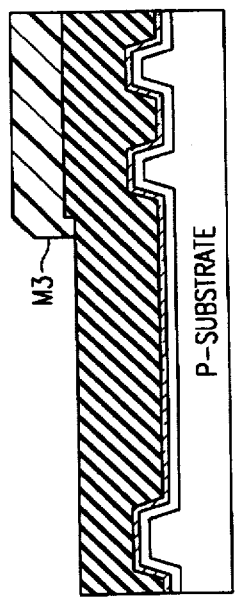
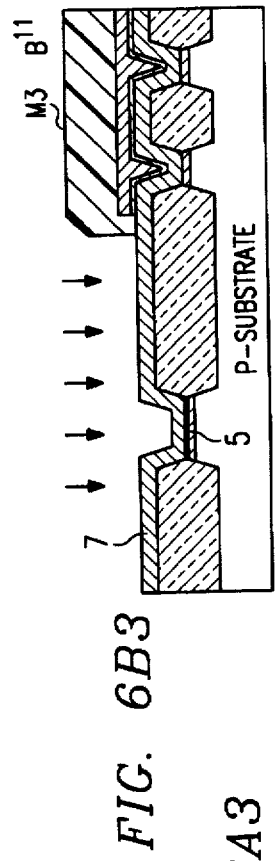
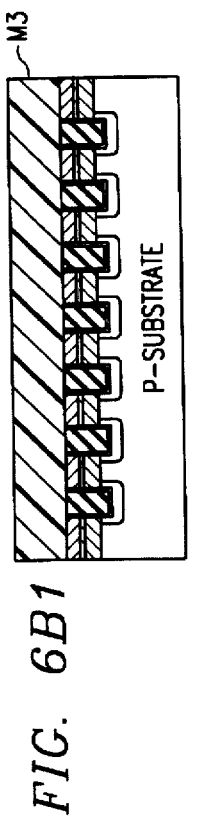
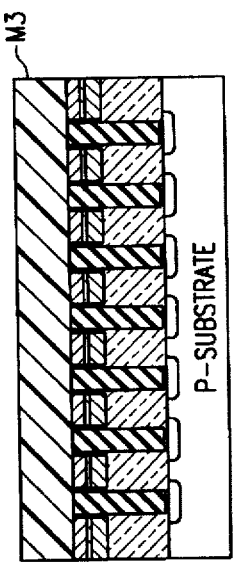
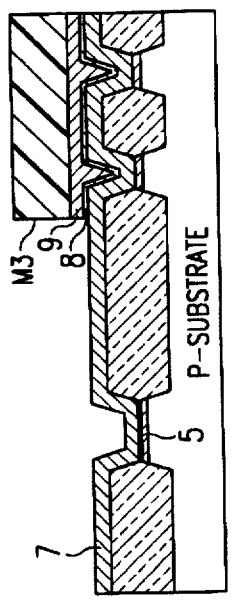
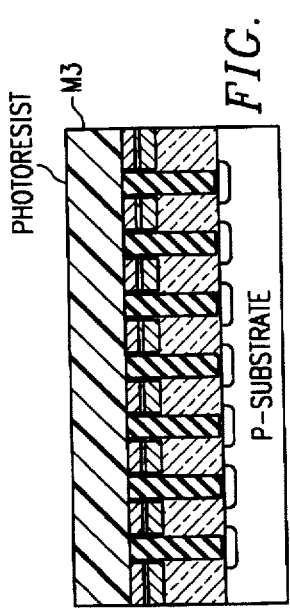
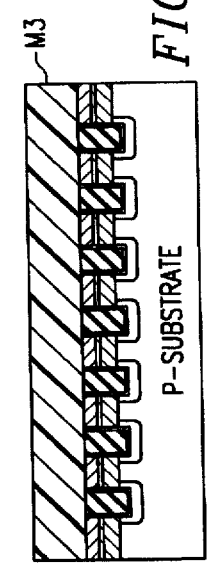
FIG. 6B1  FIG. 6B2  FIG. 6B3  FIG. 6B4
FIG. 6A1  FIG. 6A2  FIG. 6A3  FIG. 6A4

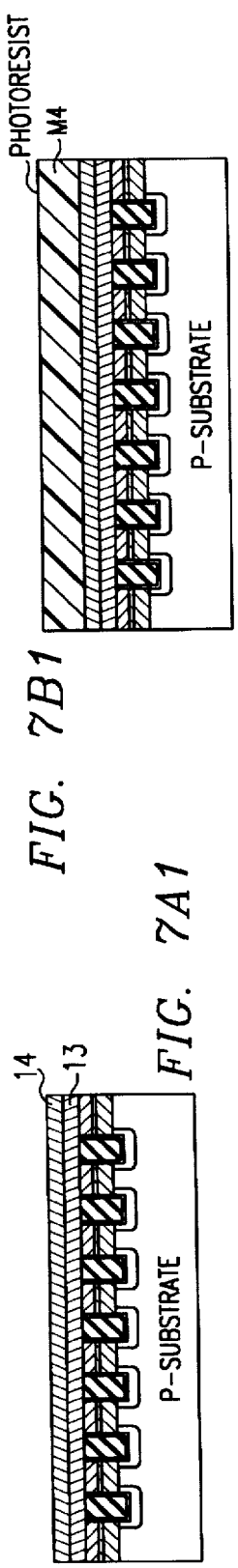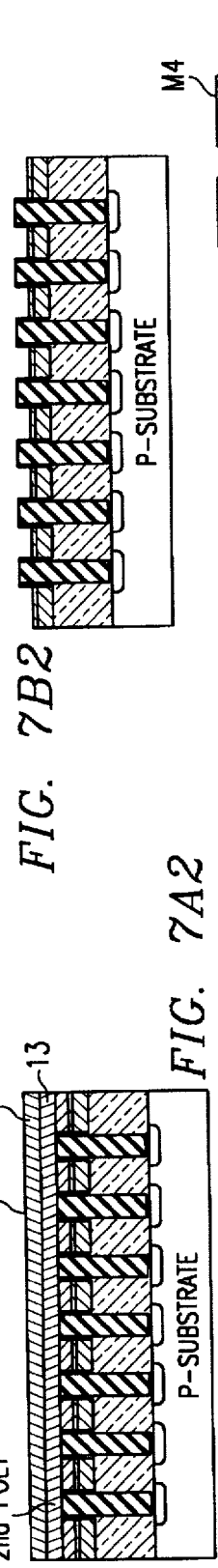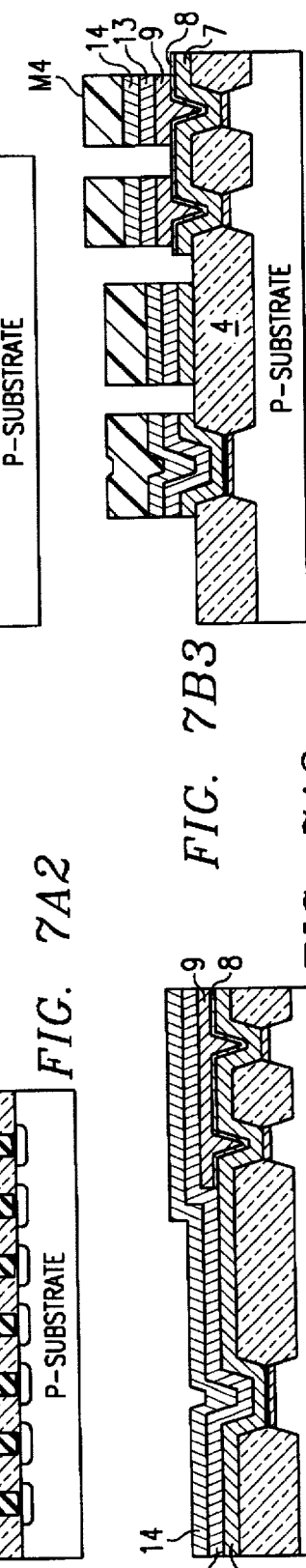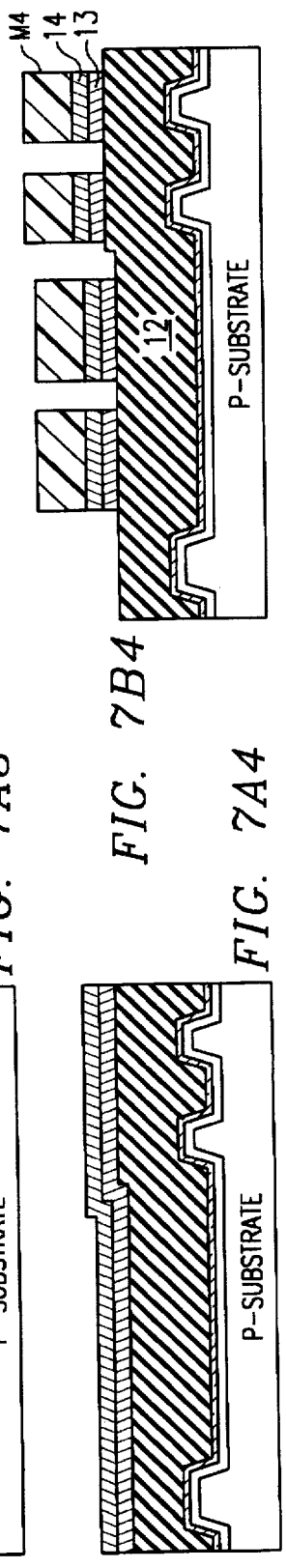

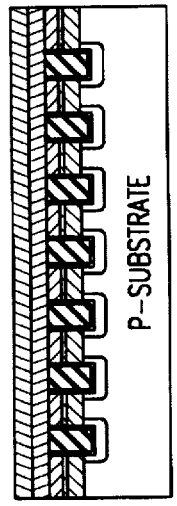
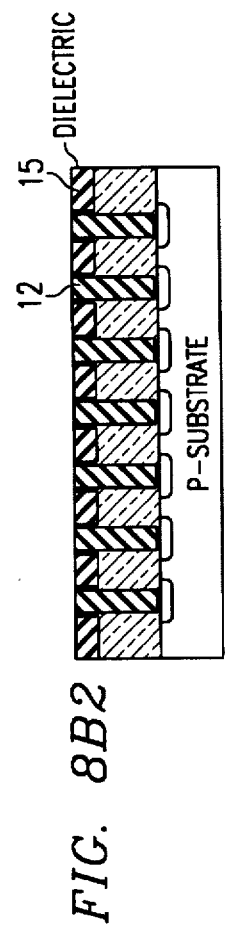
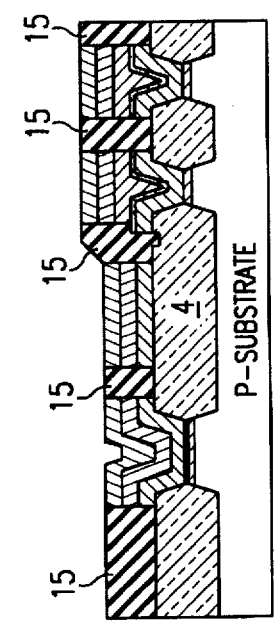
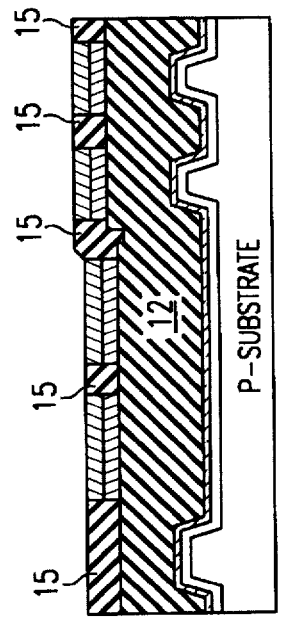
FIG. 8B1
FIG. 8B2
FIG. 8B3
FIG. 8B4
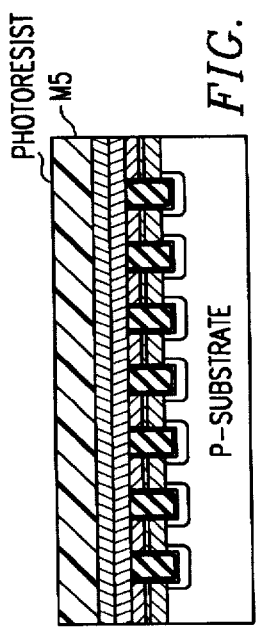
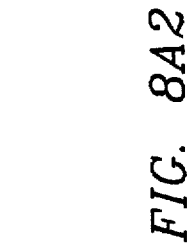
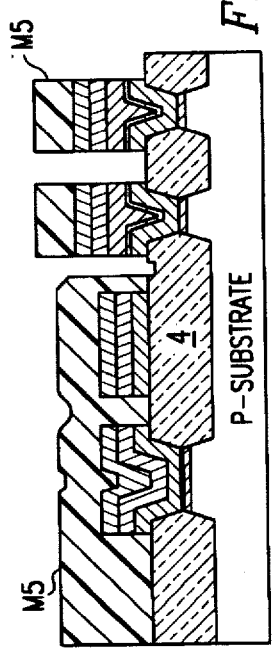
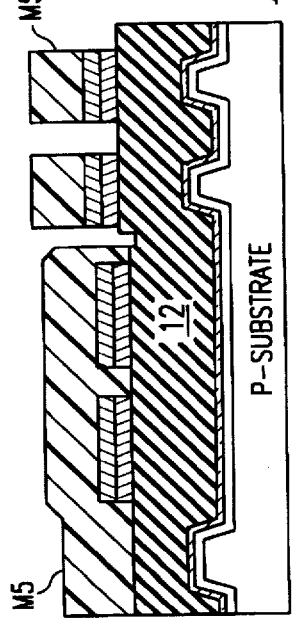
FIG. 8A1
FIG. 8A2
FIG. 8A3
FIG. 8A4

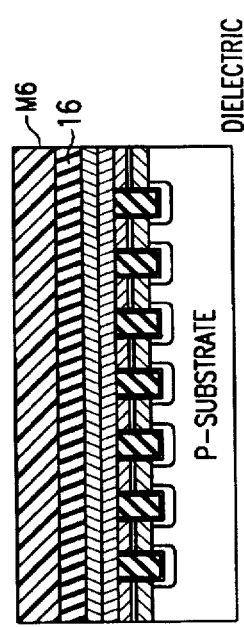
FIG.9B1
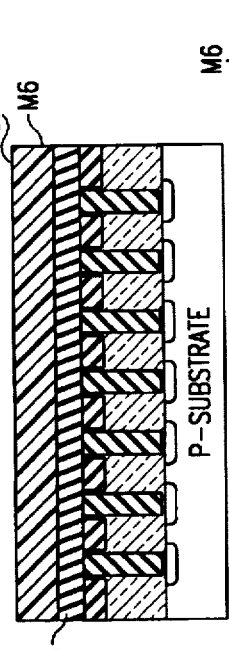
FIG.9B2
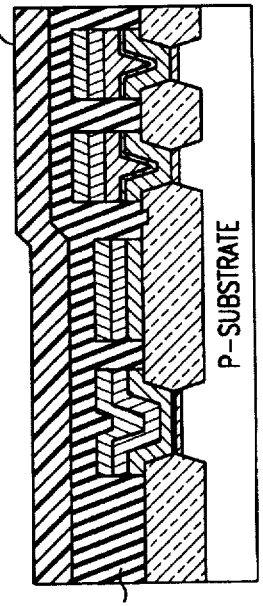
FIG. 9A3
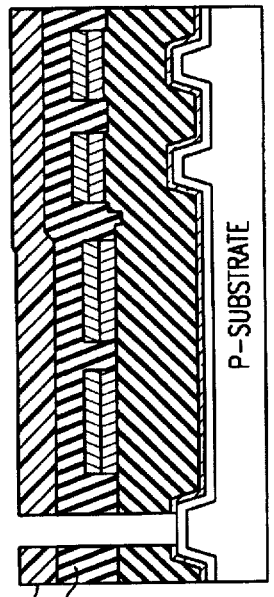
FIG. 9A4
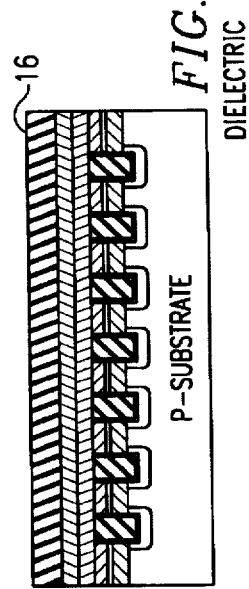
FIG. 9A1
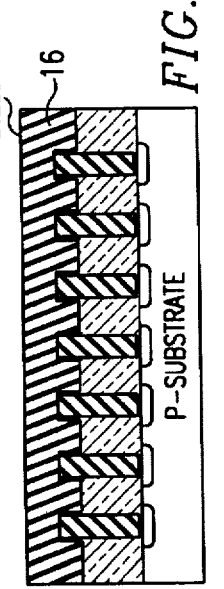
FIG. 9A2
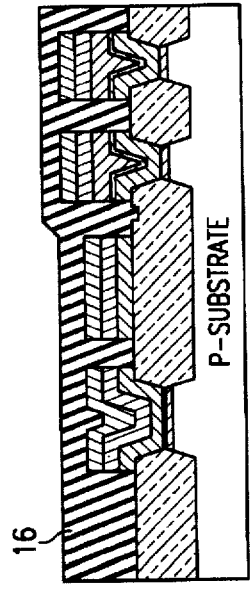
FIG. 9B3
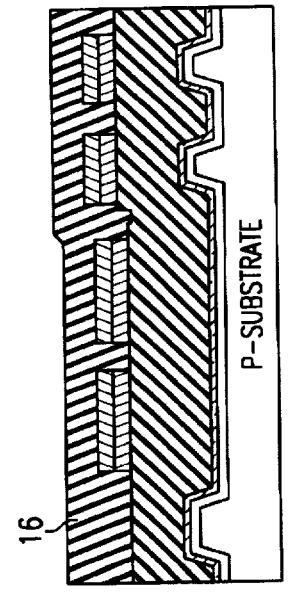
FIG. 9B4

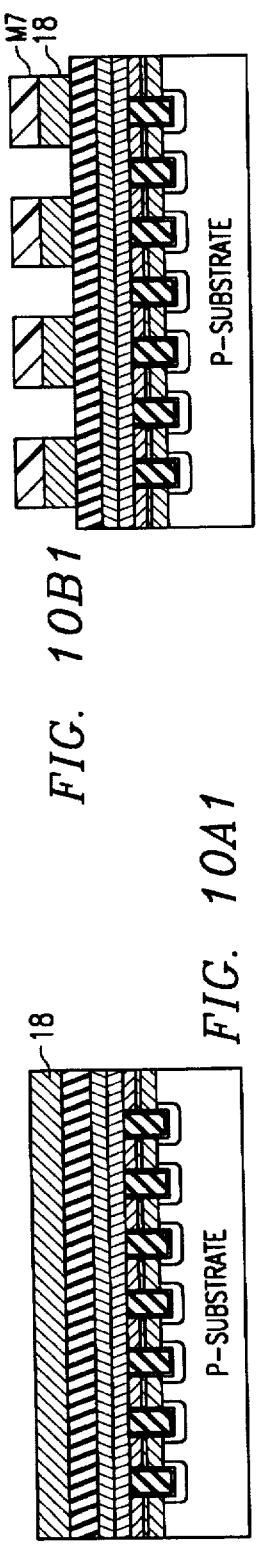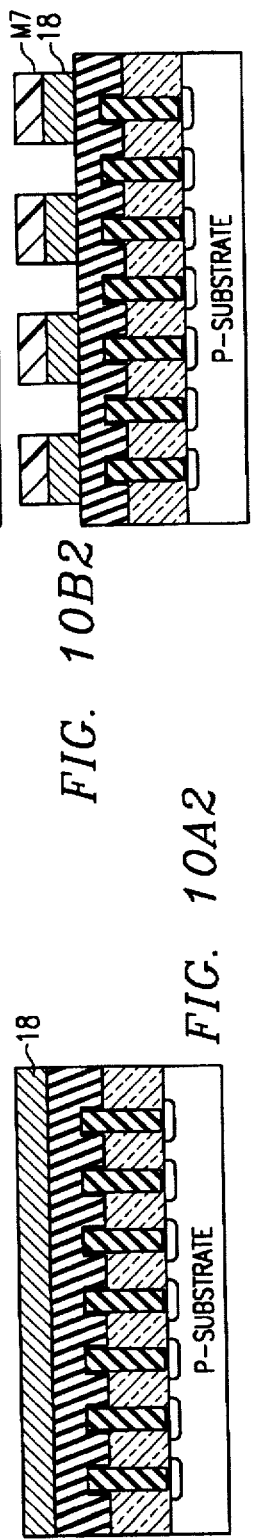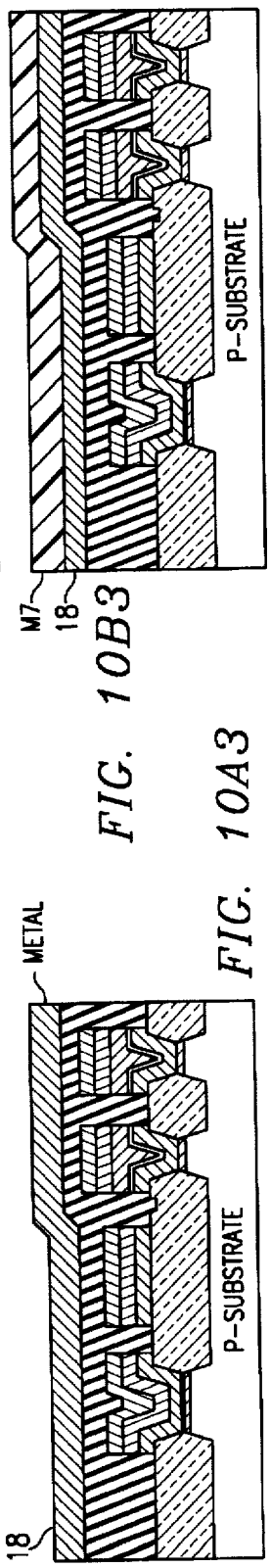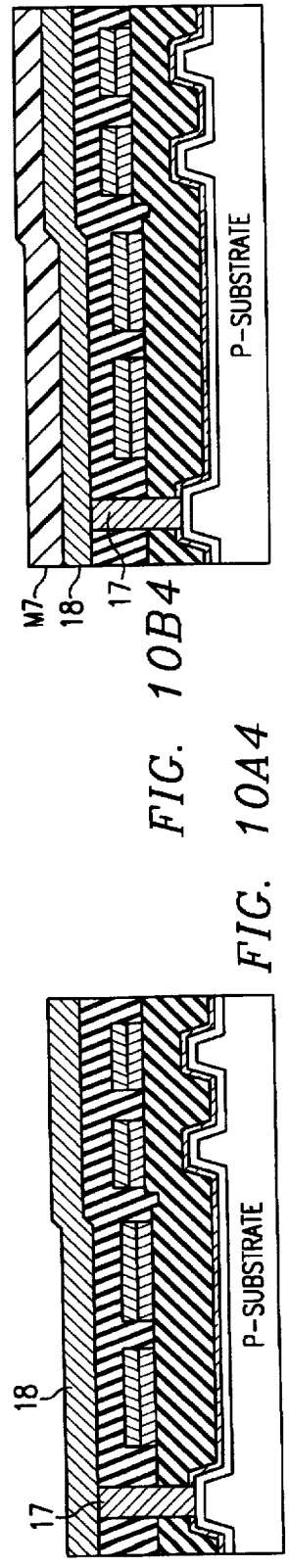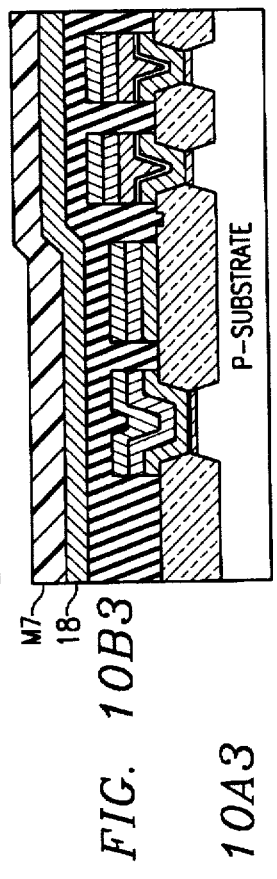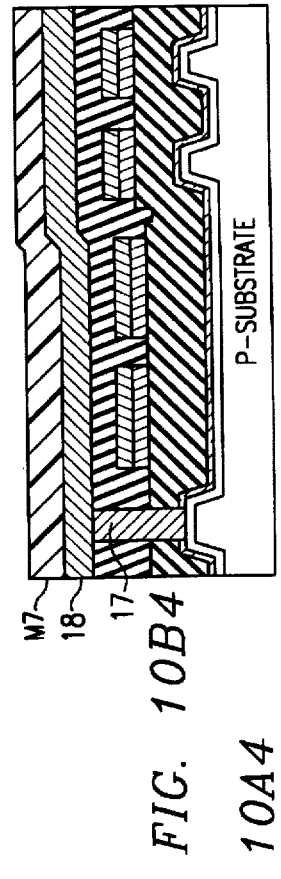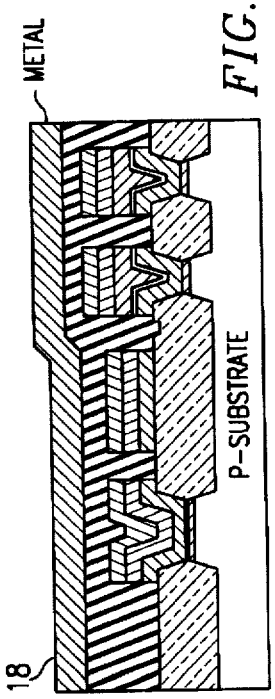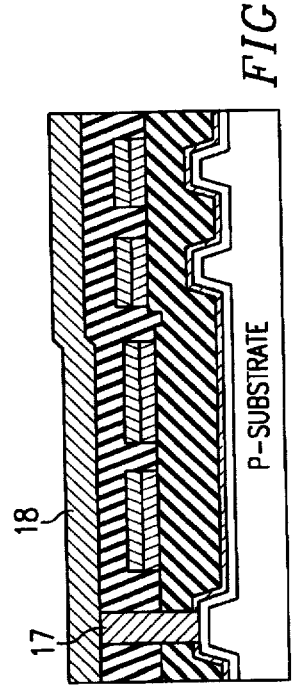

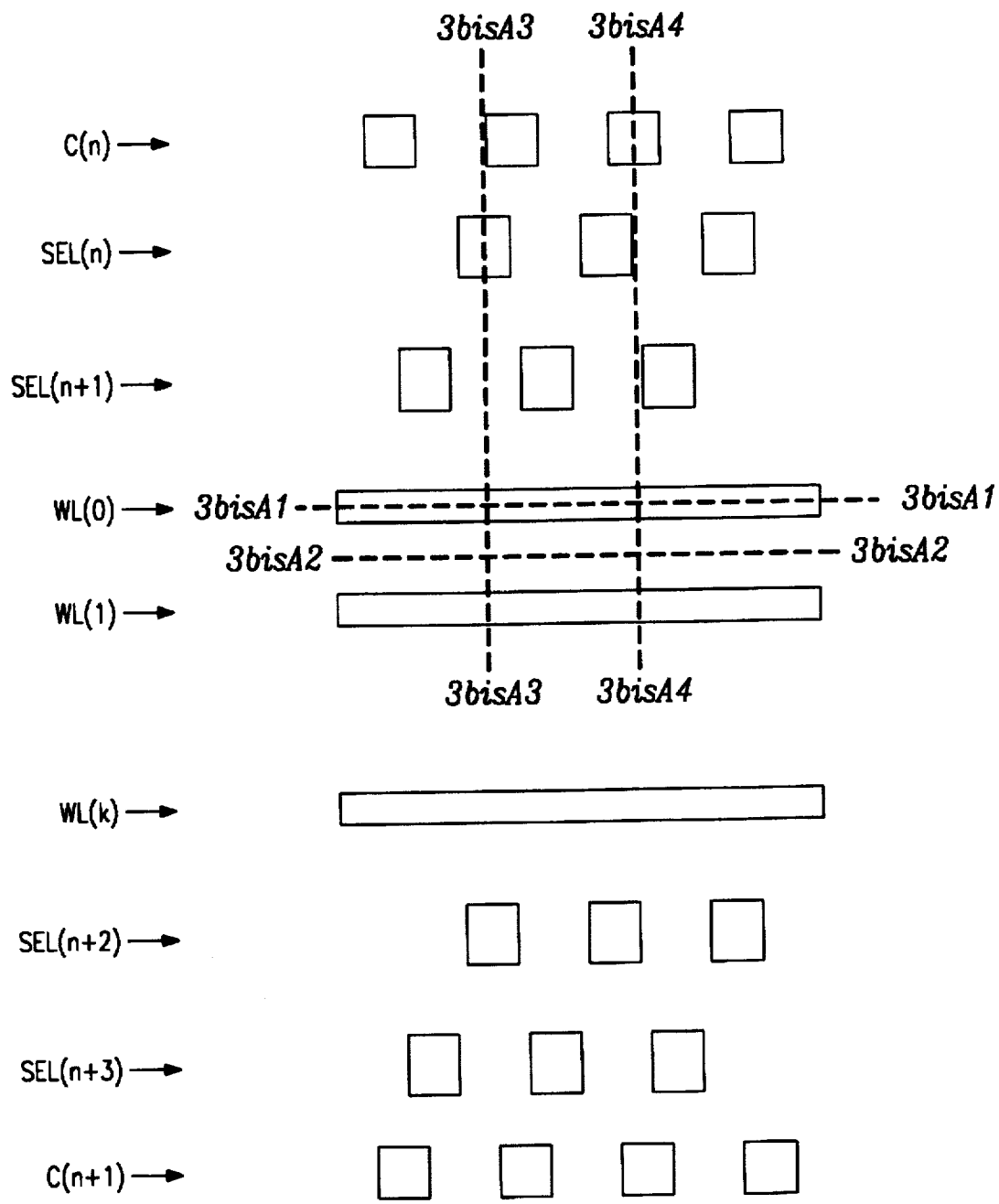
FIG. 3bis

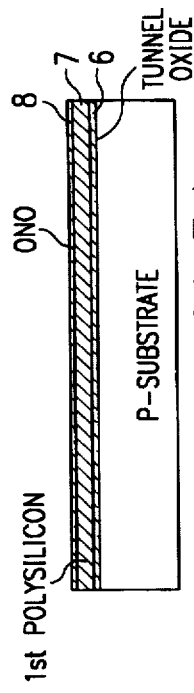
FIG. 3bisB1
FIG. 3bisB2
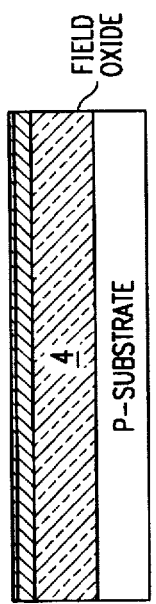
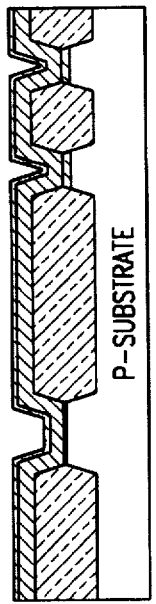
FIG. 3bisB3
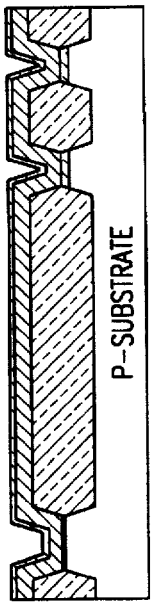
FIG. 3bisB4
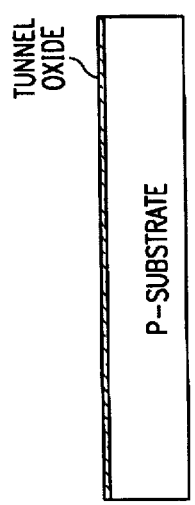
FIG. 3bisA1
FIG. 3bisA2
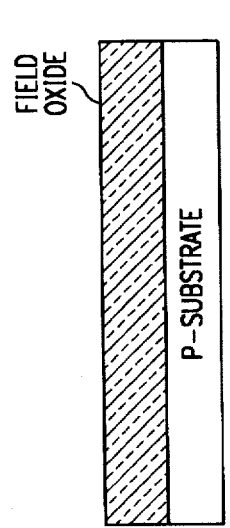
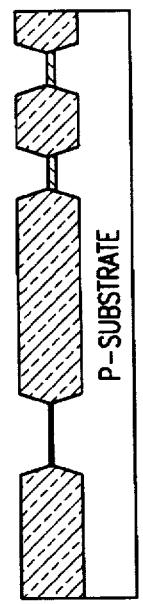
FIG. 3bisA3
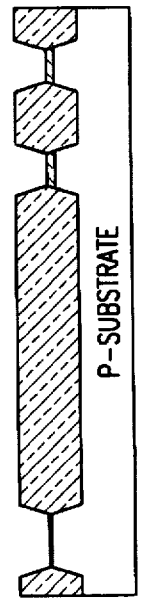
FIG. 3bisA4

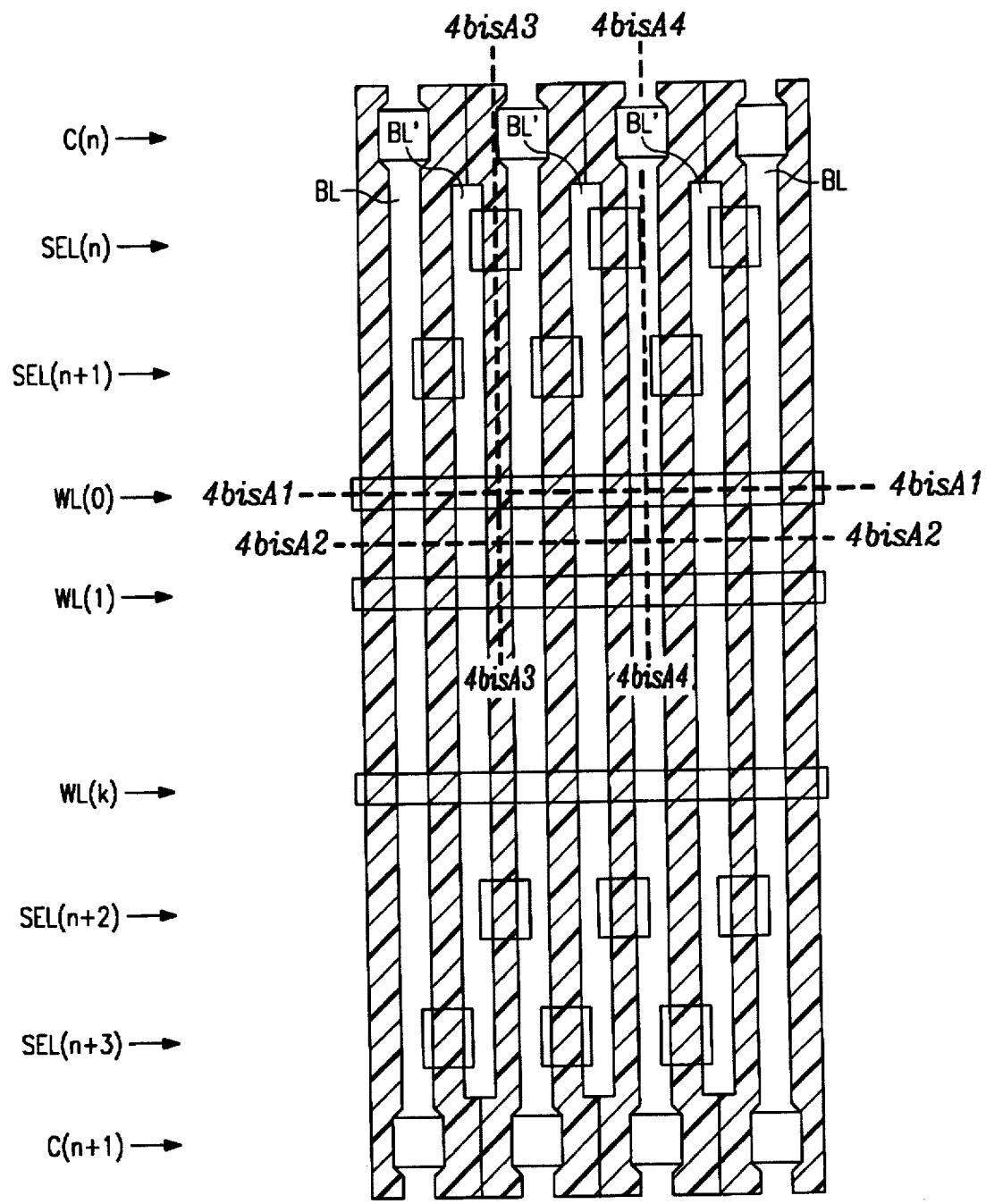
FIG. 4bis

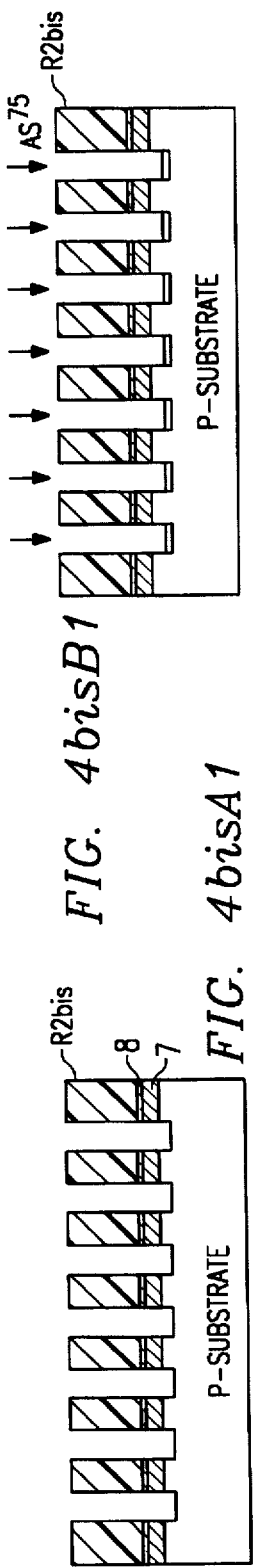
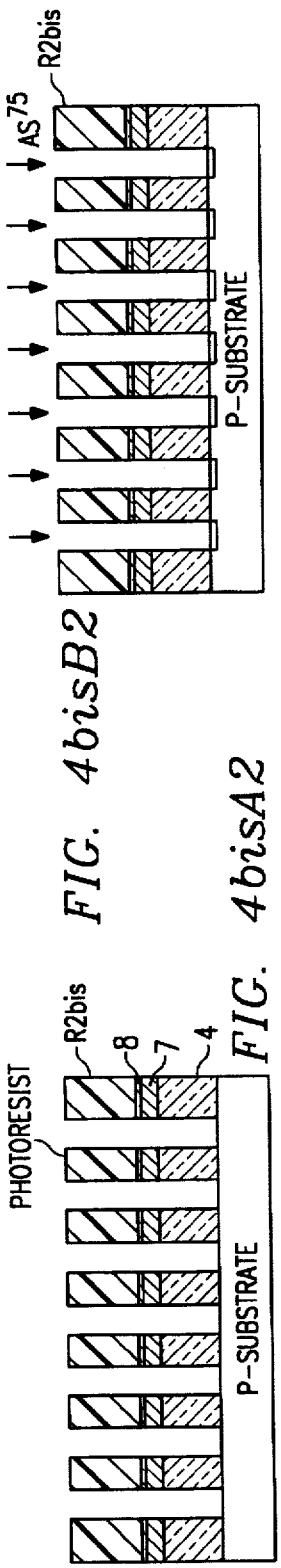
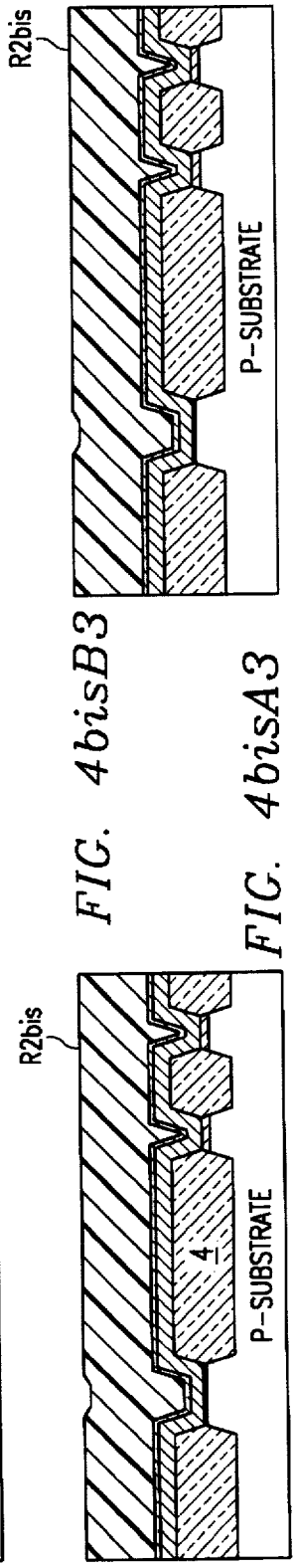
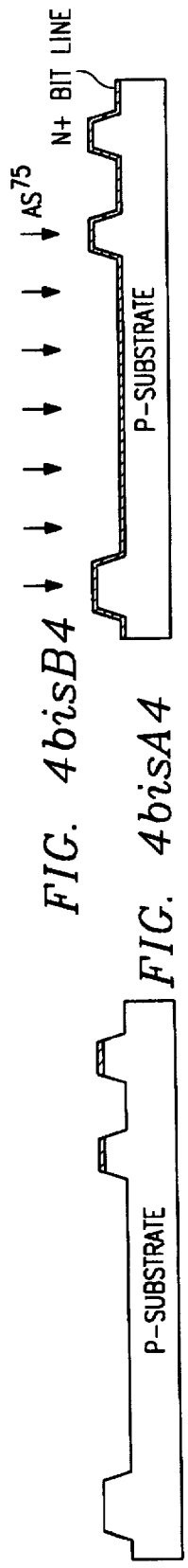

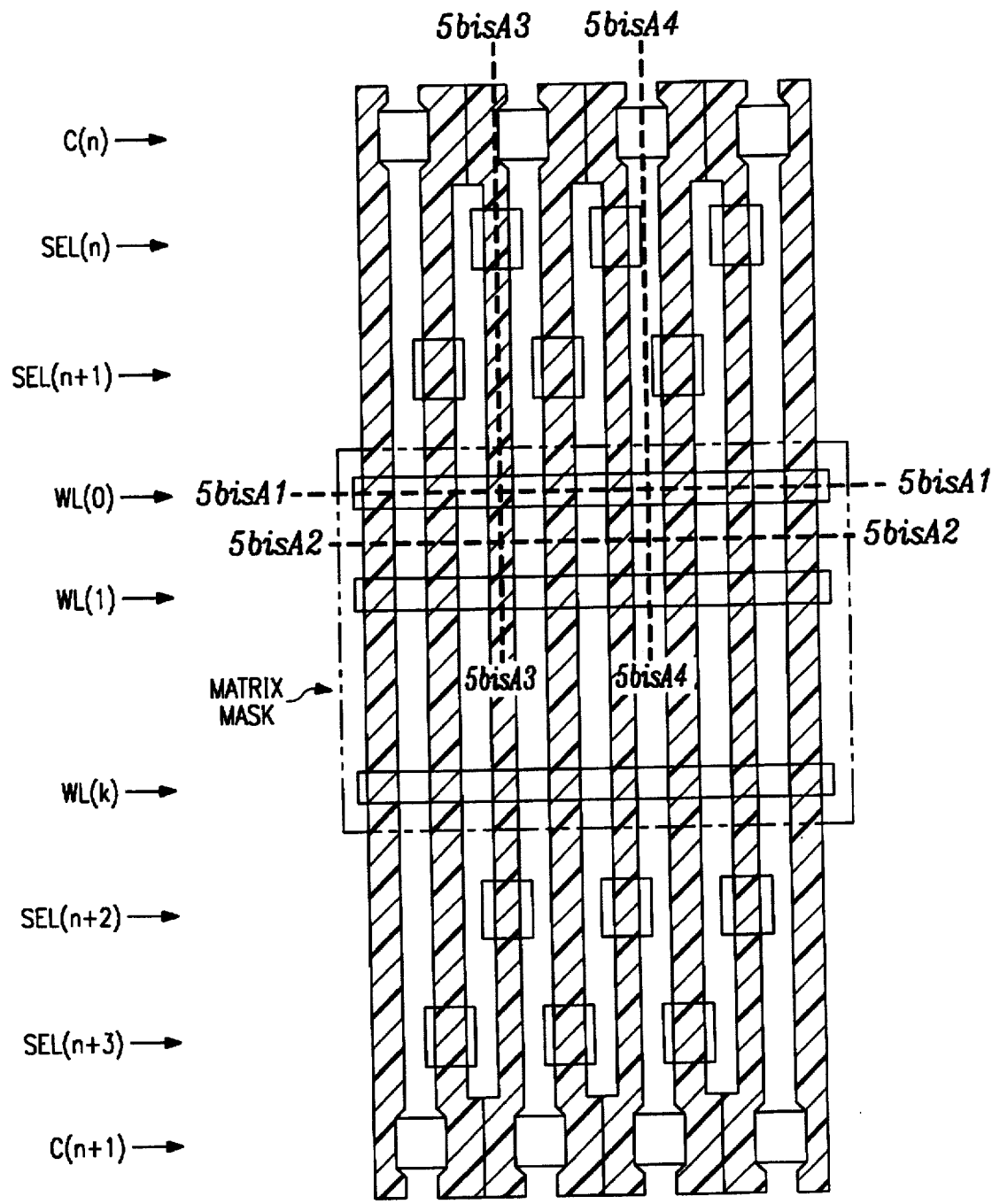
FIG. 5bis

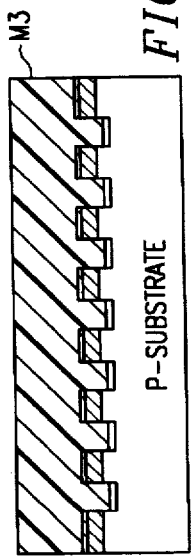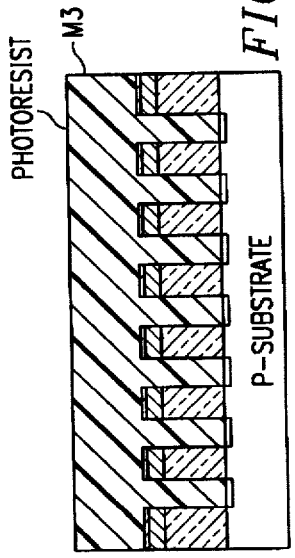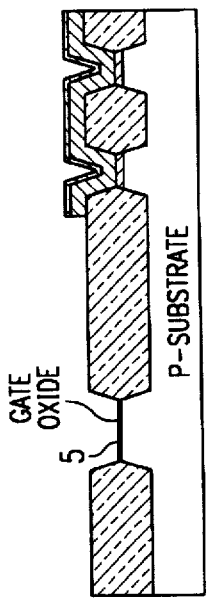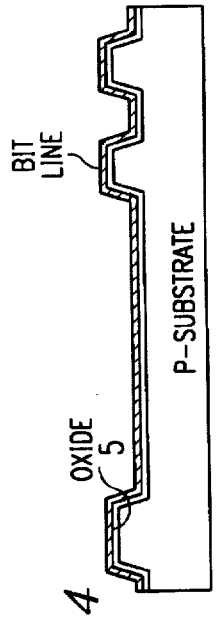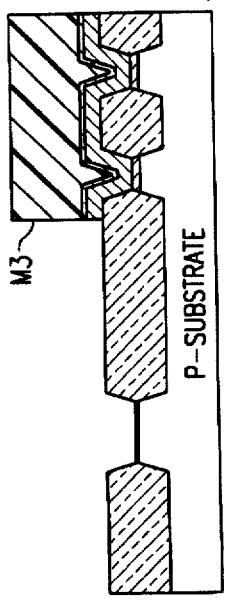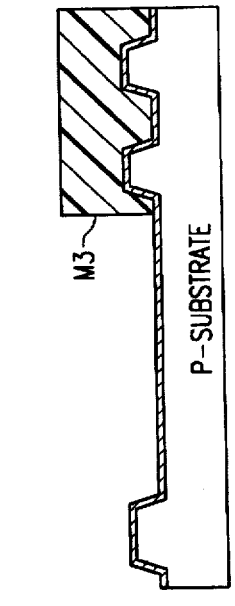

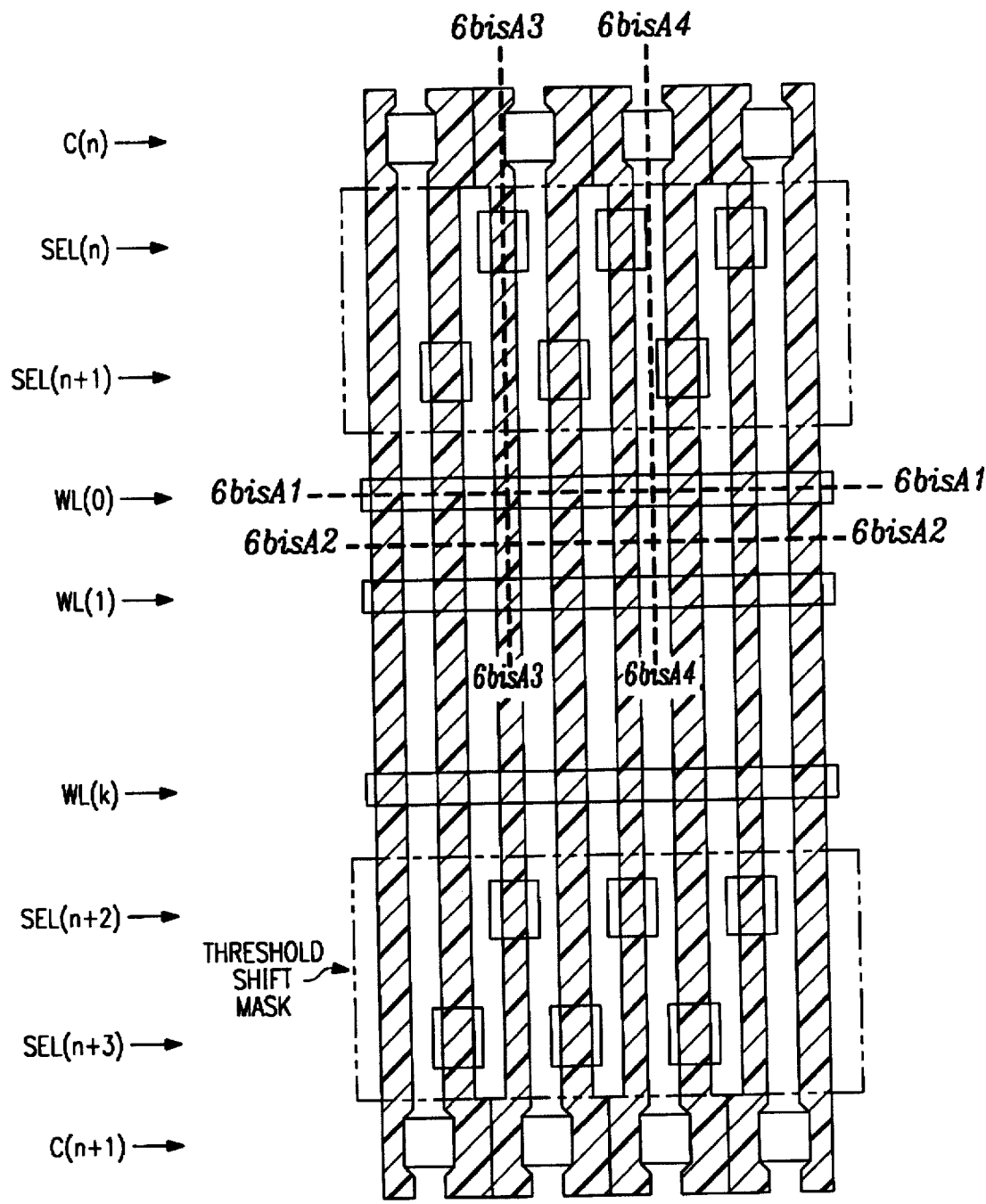
FIG. 6bis

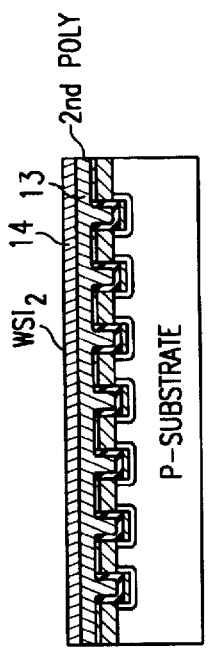
FIG. 6bisA1
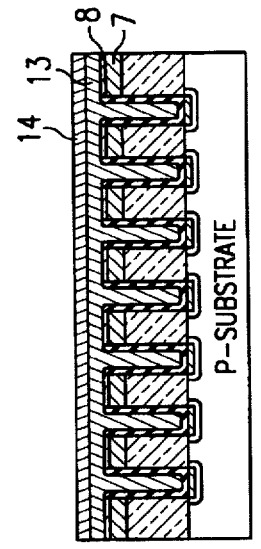
FIG. 6bisA2
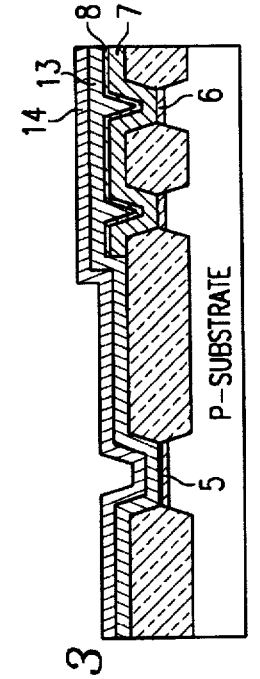
FIG. 6bisA3
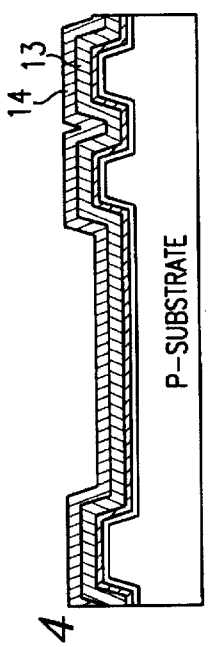
FIG. 6bisA4
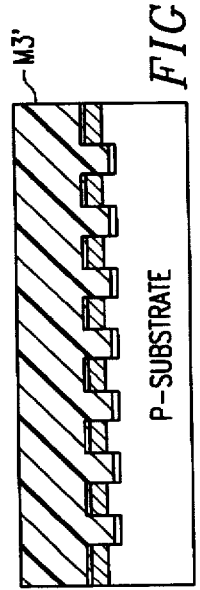
FIG. 6bisB1
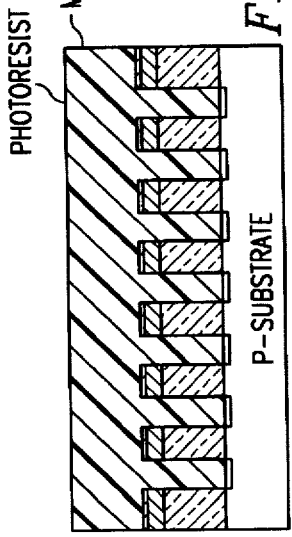
FIG. 6bisB2
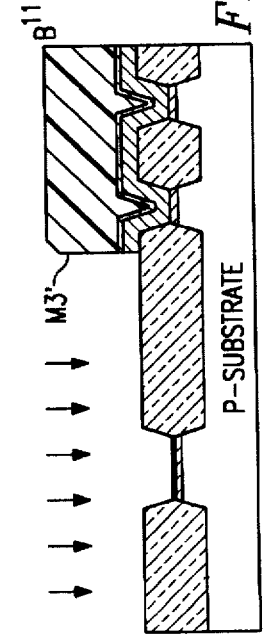
FIG. 6bisB3
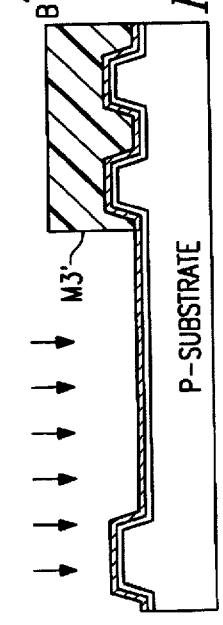
FIG. 6bisB4

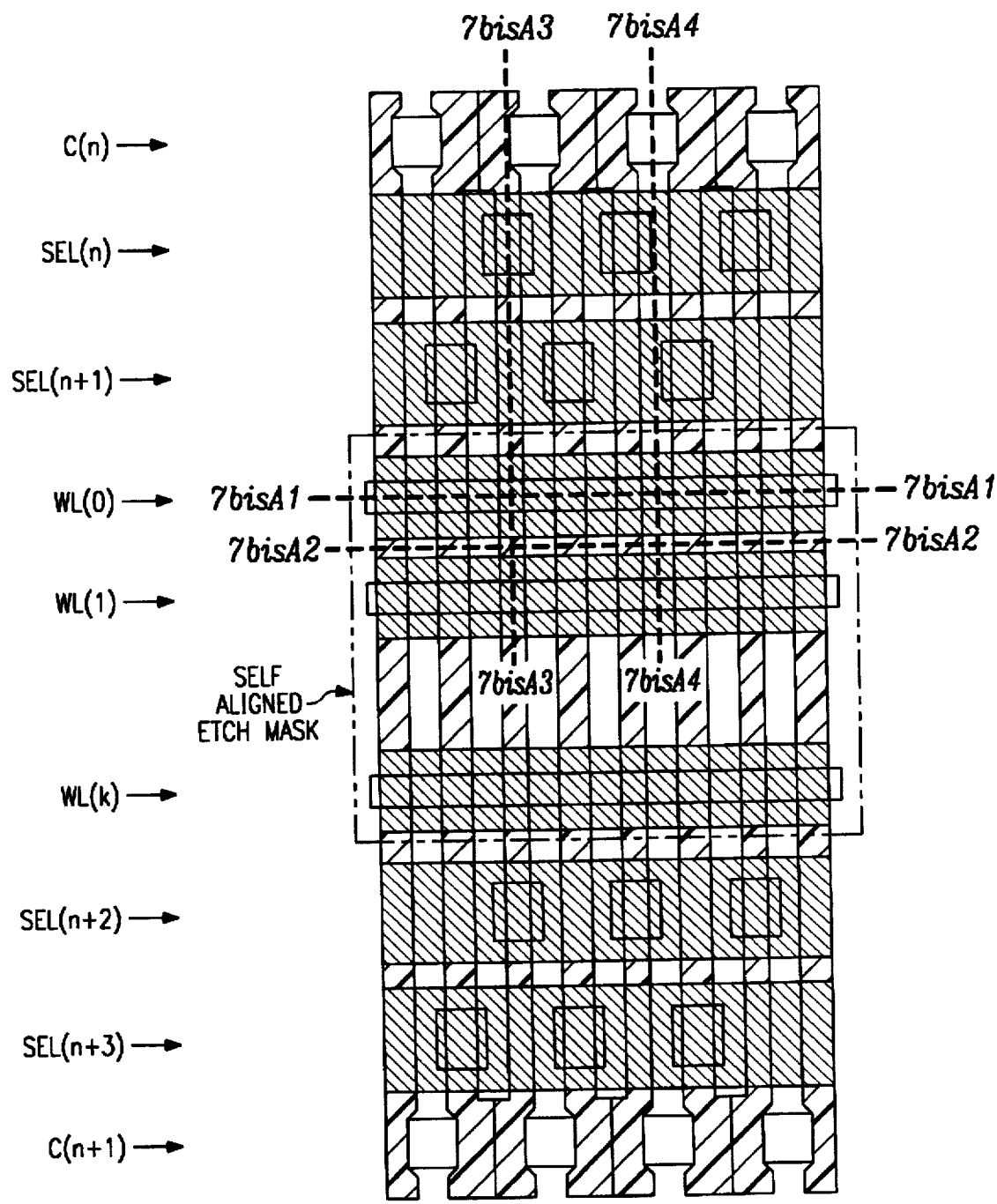
FIG. 7bis

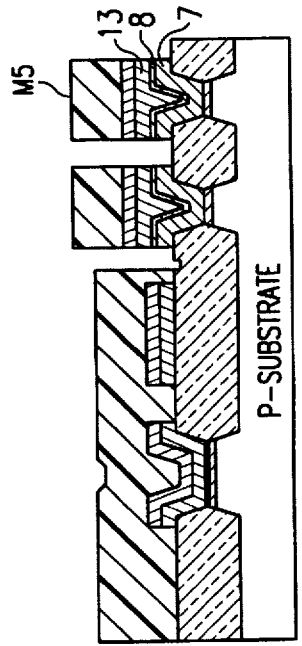
FIG. 7bisB1
FIG. 7bisB2
FIG. 7bisB3
FIG. 7bisB4
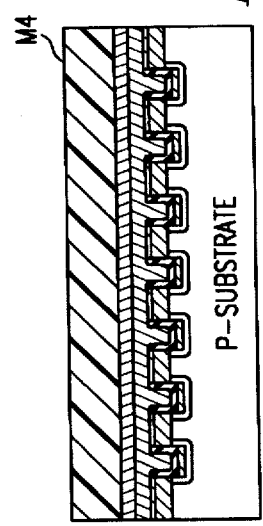
FIG. 7bisA1
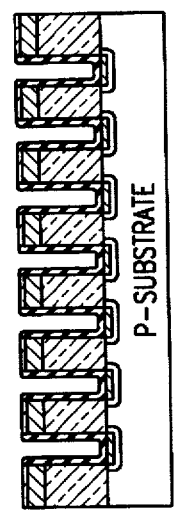
FIG. 7bisA2
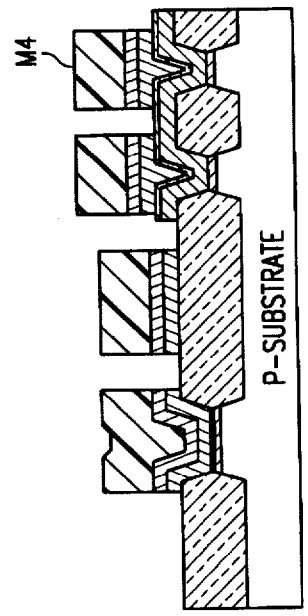
FIG. 7bisA3
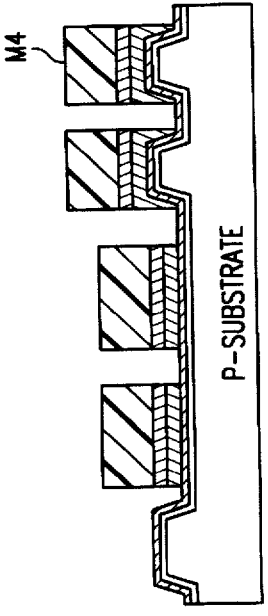
FIG. 7bisA4

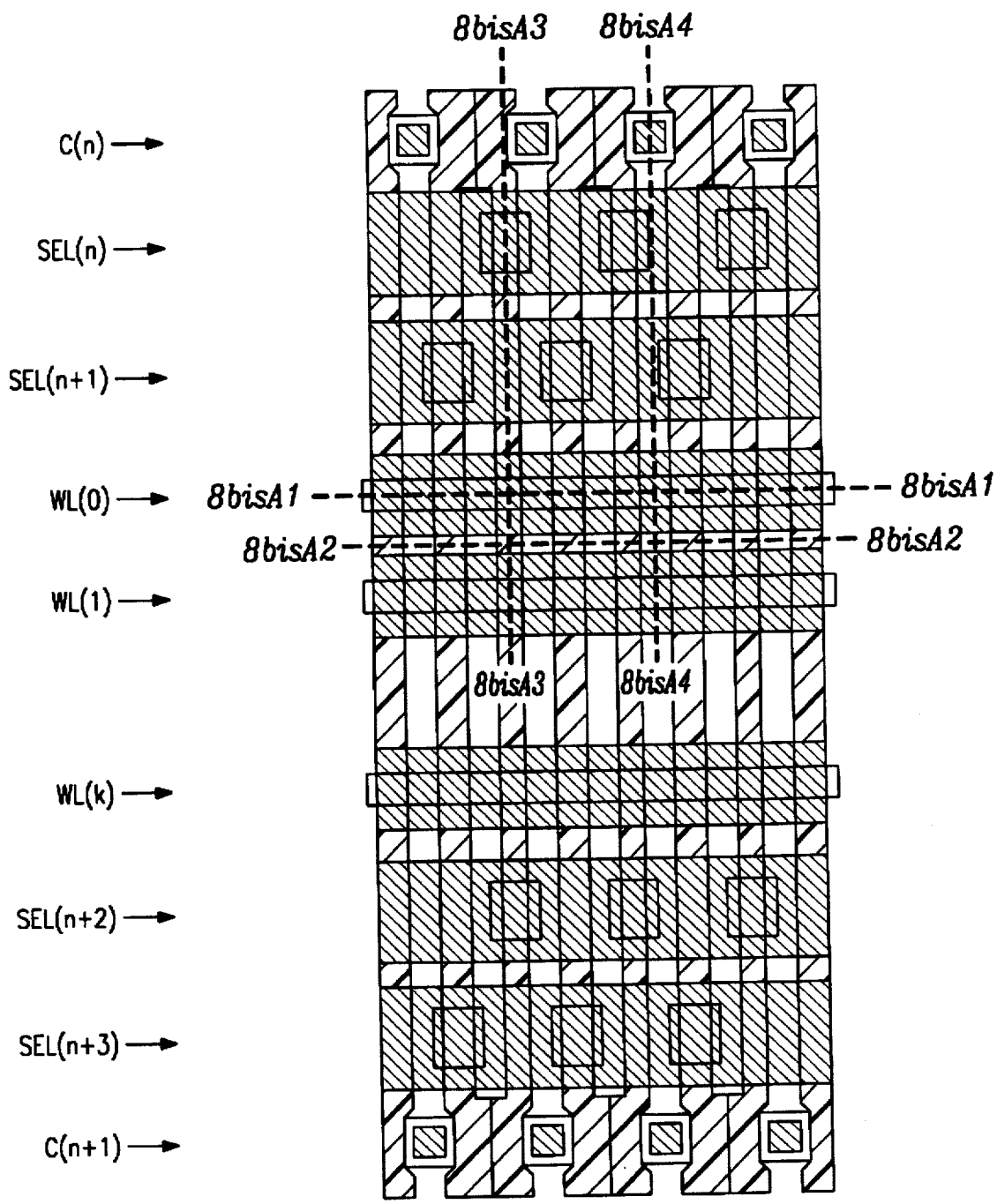
FIG. 8bis

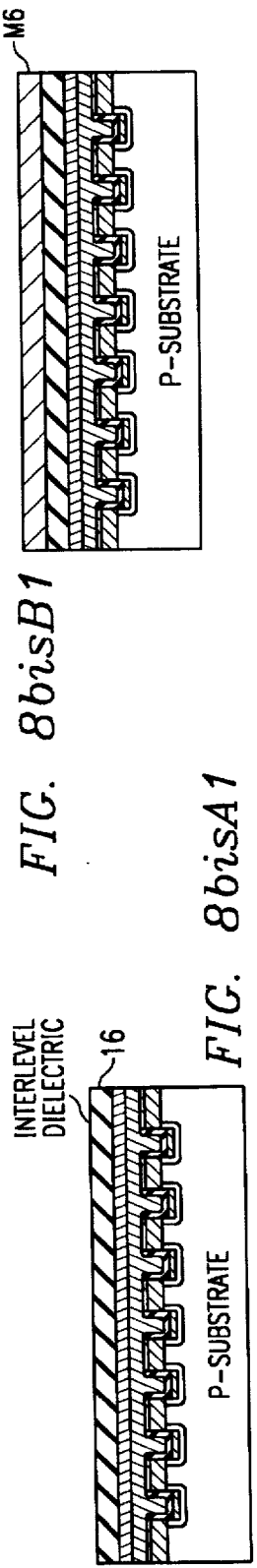
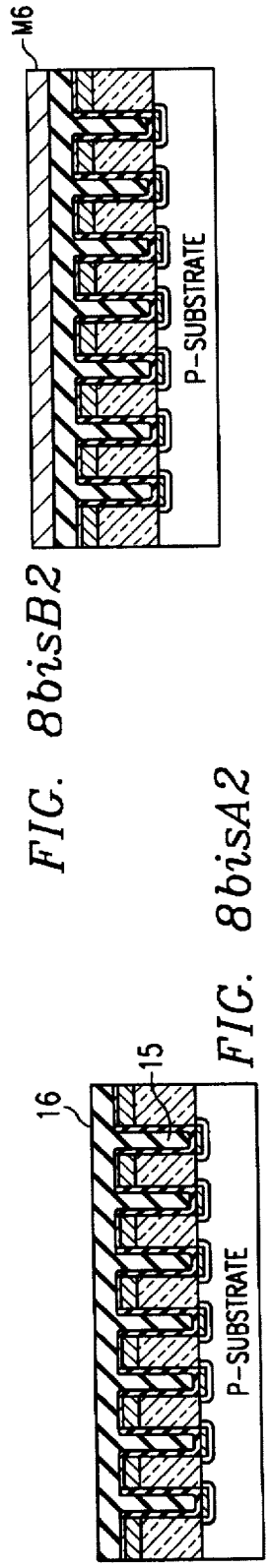
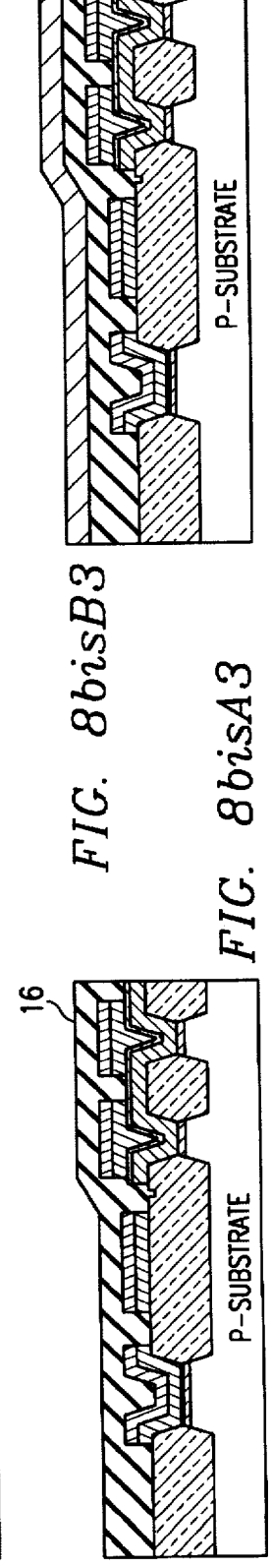
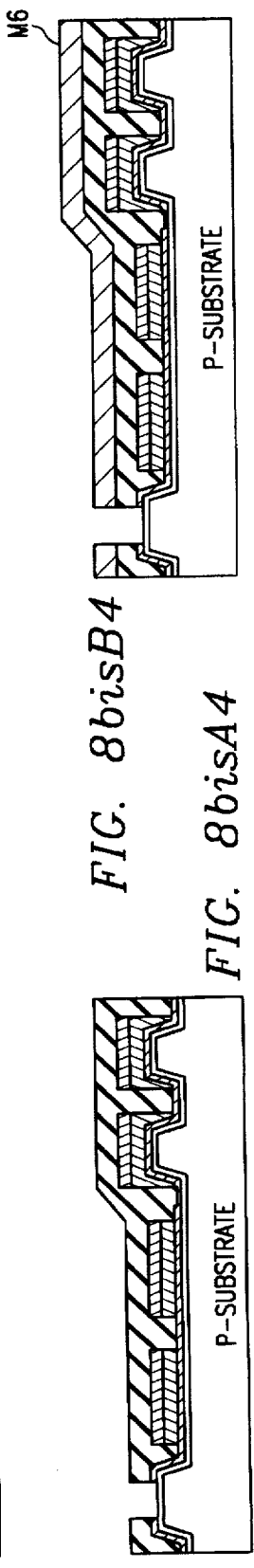
FIG. 8bisB1
FIG. 8bisB2
FIG. 8bisB3
FIG. 8bisB4
FIG. 8bisA1
FIG. 8bisA2
FIG. 8bisA3
FIG. 8bisA4

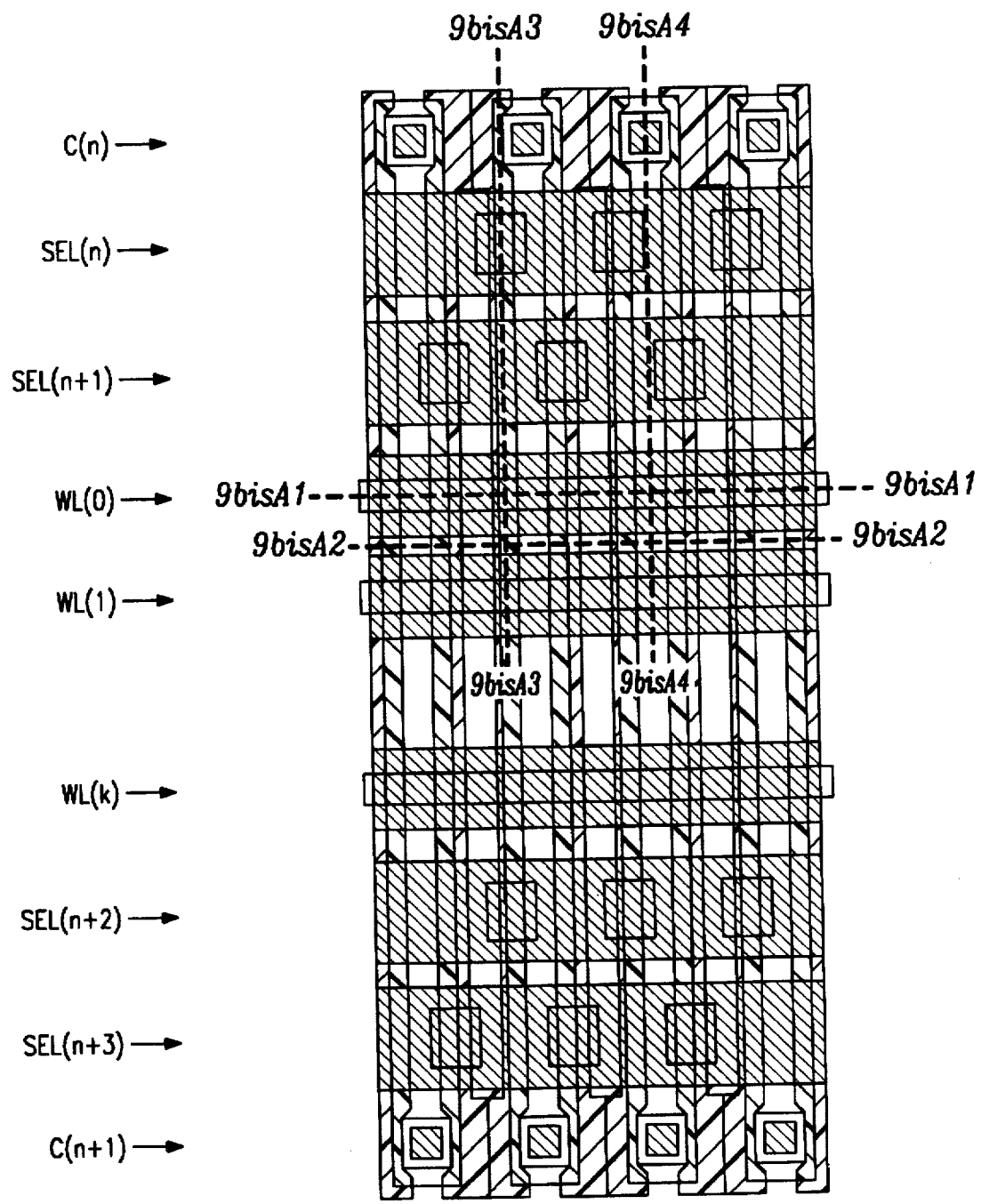
FIG. 9bis

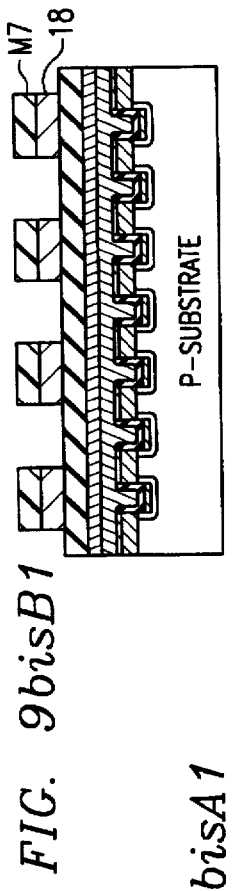
FIG. 9bisA1
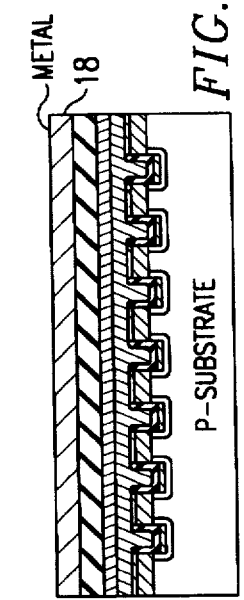
FIG. 9bisB1
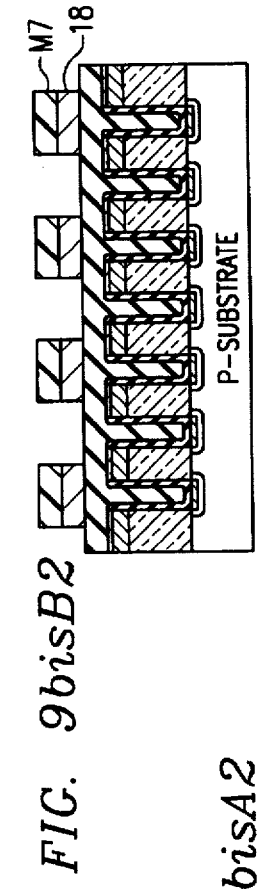
FIG. 9bisA2
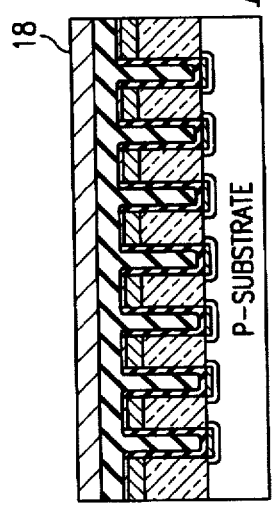
FIG. 9bisB2
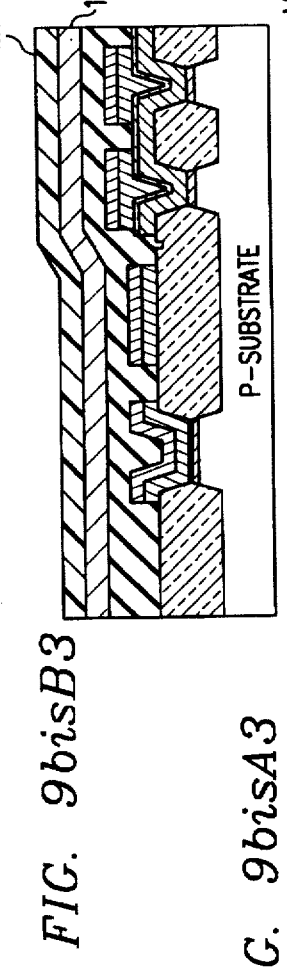
FIG. 9bisA3
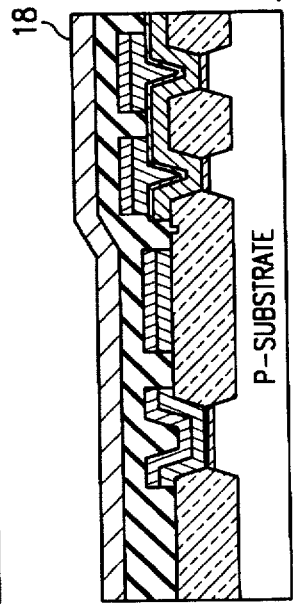
FIG. 9bisB3
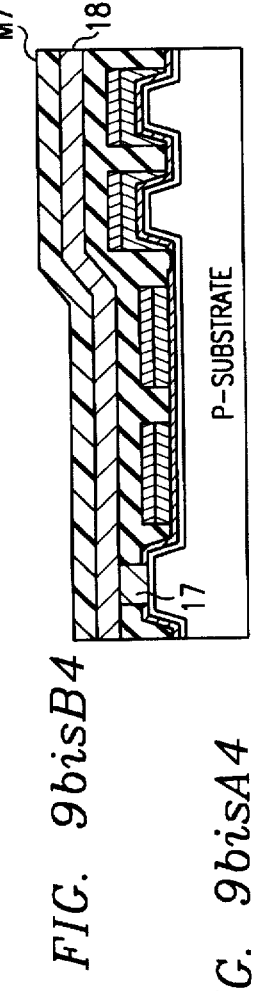
FIG. 9bisA4
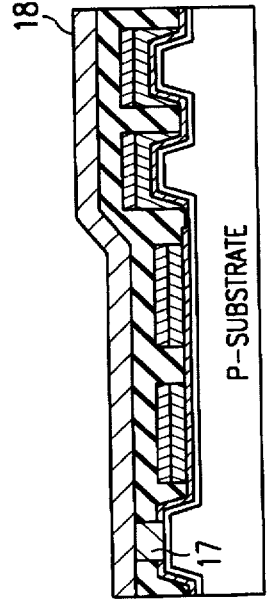
FIG. 9bisB4

PROCESS FOR FABRICATING A CONTACTLESS ELECTRICAL ERASABLE EPROM MEMORY DEVICE

CROSS REFERENCE TO RELATED APPLICATIONS

This application claims priority from R60 divisional of Ser. No. 08/070,084 filed May 28, 1993 and therethrough claiming priority from European App'n 92830282.7, filed Jun. 1, 1992.

The present invention generally relates to the fabrication of semiconductor devices and most particularly to the fabrication techniques of memory devices utilizing matrices of electrical programmable and erasable floating gate cells.

Memory devices comprising an array of cells employing floating gates, commonly of polysilicon (doped polycrystalline silicon) separated from each other by a thick field oxide layer, are well known. Electrical charge is transferred to a floating gate through a variety of mechanisms such as avalanche injection, channel injection, tunnelling and the like. A floating gate is formed above a channel region defined between a source region and a drain region of the semiconducting substrate and above the floating gate and isolated therefrom by a dielectric layer. A control gate is formed which is substantially common to all the cells arranged along a same row of the array and the resulting parallel conducting lines of control gates represent so-called wordlines for individually addressing the cells of the memory matrix. Nonvolatile, floating gate cells of a memory matrix may be erased all together in a single step, as in so-called EPROM devices, wherein the erasing takes place by UV irradiation, or in FLASH-EPROM devices, wherein the erasing mechanism of all the cells in a single operation is of electrical nature. By contrast the cells may also be electrically erasable individually, cell by cell, as in so-called EEPROM (or E²PROM) devices.

The efforts to fabricate electrical programmable memory devices having a constantly increasing density have led to the development of so-called contactless, nonvolatile, electrical programmable, memory arrays. In this type of arrays, the cells have source/drain regions in the form of continuous parallel diffused strips, often referred to as bitlines in view of the fact that they perform the function of connecting in common the source/drain regions of cells which are aligned along a same column of the array. A function that in arrays having a more traditional architecture is performed by metal lines electrically connecting in common single contacts formed in the drain area of cells disposed along a same column. A contactless matrix architecture commonly requires a virtual ground circuitry for reading and programming. An example of these matrices of memory cells and of the relative fabrication process is disclosed in U.S. Pat. No. 4,780,421. In practice, this type of contactless architecture permits a reduction by at least an order of magnitude of number of contacts which must be formed in a memory matrix and this greatly alleviates the technological problems relative to the formation of submicron size contacts. In U.S. Pat. No. 5,087,584, another contactless type memory matrix and process of fabrication are disclosed according to which islands of a stack comprising: a gate oxide, a first level doped polysilicon floating gate, a thin interpoly dielectric, and a second level doped polysilicon control gate, by a cross-point definition technique. Subsequently trenches are cut in an isolating dielectric planarization layer until exposing distinct, preformed, control gates and finally the trenches are filled with a metal, thus forming the wordlines (i.e. the control gate lines) of the matrix. This particular cell architecture, though providing a good capacitive coupling between a floating gate and a control gate, requires the formation of contacts for each diffused bitline, and this fact imposes an extremely small pitch of definition of the metal lines thus enhancing technological problems of alignment and definition upon reduction of cell size (scaling down).

A contactless memory matrix which permits an extremely high density by virtue of cross-point definition of the active areas occupied by the single cells and wherein the floating gate is self-aligned to wordlines as well as to bitlines is disclosed in the article entitled: "Alternate Metal Virtual Ground (AMG)—A New Scaling Concept for Very High-Density EPROM's," by Boaz Eitan, 12 IEEE Election Device Letters pp. 450ff (August 1991). In accordance with the architecture described in this article, a further halving of the necessary number of contacts necessary and therefore a "doubling" of the definition pitch of metal lines for the same degree of compactness is obtained by forming two "orders" "or families" of diffused bitlines. The bitlines belonging to a first order are continuous and extend for the entire column-wise length of the matrix and are contacted through a certain number of contacts, from each other, in order to reduce line resistance, while the bitlines belonging to the other order are interrupted and alternately arranged between the continuous bitlines of the first order and are electrically contacted through dedicated select transistors, disposed in an offset manner every certain number of memory cells (wordlines) and are driven through dedicated select lines which are alternately disposed with and parallel to every certain number of wordlines.

On the other hand, the self-alignment of the gate structure to the wordlines and bitlines and the two orders of bitlines, i.e. continuous and interrupted, though permitting a doubling of the definition pitch of the metal lines for the same compactness of the matrix, do not permit the formation of electrical erasable memory cells because, already with an interpoly dielectric layer having a thickness in the order of 20–25 nm, the gate capacitance ratio which may be obtained is less than 0.5 and, if the gate oxide were to be replaced with a tunnel (thinner) oxide, having a thickness of 9–12 nm, in order to fabricate a FLASH-EPROM or EEPROM memory, i.e. an electrical erasablememory device, the gate capacitive ratio would be further reduced and would become about 0.3. In these conditions acceptable electrical performances cannot be obtained from the single cells. On the other hand, a normal "T"-shaped layout of a classic EEPROM cell, i.e. of an electrically erasable cell, poses severe limitations to the possibility of reducing the size of the cell in addition to the other technological problems which are represented by the enormous number of contacts necessary for an EEPROM architecture of a known type.

There is still a need for an electrically programmable and most preferably also electrically erasable memory device (EEPROM or FLASH-EPROM) having a high density, i.e. a relatively small cell area, with a contactless architecture thus requiring a reduced number of contacts and wherein the metal definition pitch remains relatively large.

As it will be shown, the present invention provides a memory device which eliminates the drawbacks and/or the limitations of the known devices, thus fully achieving the above-noted objects.

The architecture that is implemented with the process of the invention permits ultrahigh density, electrically erasable memory devices (e.g. 64 Mbit devices) to be obtained. By utilizing a process with a minimum linewidth of 0.6 µm, it is possible to achieve a cell area (including overhead) of just 2.62 μm$^2$ as compared to an area of 4.46 μm$^2$ which could be obtained for a standard "T"-shaped cell. The process of the invention may be utilized within a conventional CMOS process with two levels of polysilicon and with one or more levels of metal and may be carried out using standard apparatuses, without introducing particularly critical steps in the process flow.

Basically, the process of the invention produces a gate structure which is self-aligned to wordlines and bitlines diffused in the semiconducting substrate and which overlay edges partially of a patterned field oxide layer which define said diffused bitlines, thus achieving a sufficiently high capacitive ratio to permit erasing of the cells by electrically biasing the control gate for discharging, through a Fowler-Nordheim tunnelling mechanism, the programming electrical charge from the floating gate to the substrate. The definition (separation) of the gate structures of single cells in a bitline direction takes place through a self aligned etching of the interpoly dielectric and of the first level polysilicon (floating gate) after having masked and etched the second level polysilicon and therefore after having already defined the gates of the circuitry and of the select transistors as well as the wordlines, i.e the control gates of the cells. From this point onward the fabrication process may continue in a conventional way. By virtue of the fact that every other bitline is contacted through a certain number of contacts, the effective definition pitch of the metal will be twice the cells' pitch. Commonly, if δ is the minimum line definition width of the process, for a standard "T"-shaped cell the minimum definition pitch for the polysilicon is equal to 2δ, that for the metal is 3δ. By contrast in the process of the invention, while in a wordline direction the cell pitch is limited exclusively by the minimum definition width of the polysilicon (e.g. 2δ), the definition pitch of the metal becomes 4δ and so it may be regarded as quite uncritical.

According to a first and preferred embodiment of the process of the invention, which differs from a second alternative embodiment by the fact that the definition of the polysilicon of first level takes place by defining slits projectively coinciding with the bitlines while in the .second embodiment strips of polysilicon are defined instead which will originate the floating gates, there is the advantage that the same definition mask for the polysilicon of first level may be used also as the implant mask for diffusing the bitline regions in the semiconducting substrate, thus saving a mask.

BRIEF DESCRIPTION OF THE DRAWING

The peculiar characteristics of the invention are defined in the annexed claims, nevertheless, the different aspects and characteristics of the invention will be more easily understood through the description of several preferred embodiments of the invention and by referring to the series of annexed drawings, wherein:

the series of Figures from 1, 1A1–1A4 and 1b1–1B4 through 10, 10A1–10A4 and 10B1–10B4 show, through a sequence of fragmentary plan and sectional views into orthogonal section planes, a first embodiment of the process of the invention; the series of Figures from 3bis, 3bisA1–3bisA4 and 3bisB1–3bisB4 through 9bis, 9bisA1–9bisA4 and 9bisB1–9bisB4 illustrate an alternative embodiment of the invention.

DETAILED DESCRIPTION

The following description of fabrication processes contains numerous details, such as for example, doping levels, dimensions, etc., in order to provide complete information on how to practice the invention. It will be obvious, however, that these details may also be varied when practicing the invention. On the other hand, certain process steps are not herein described in great detail in order not to overburden the description with elements which are not strictly necessary to a skilled technician for practicing the invention. The process is depicted through a sequence of three types of figures, a plan view and vertical cross sections on two orthogonal section planes. Each type of cross sectional illustration contains in turns four different cross sectional views which are relative to four different section planes as identified in the respective plan view and representing two successive steps of the fabrication process. The use of labels and inscriptions further facilitates the reading of the figures.

Figure 1:
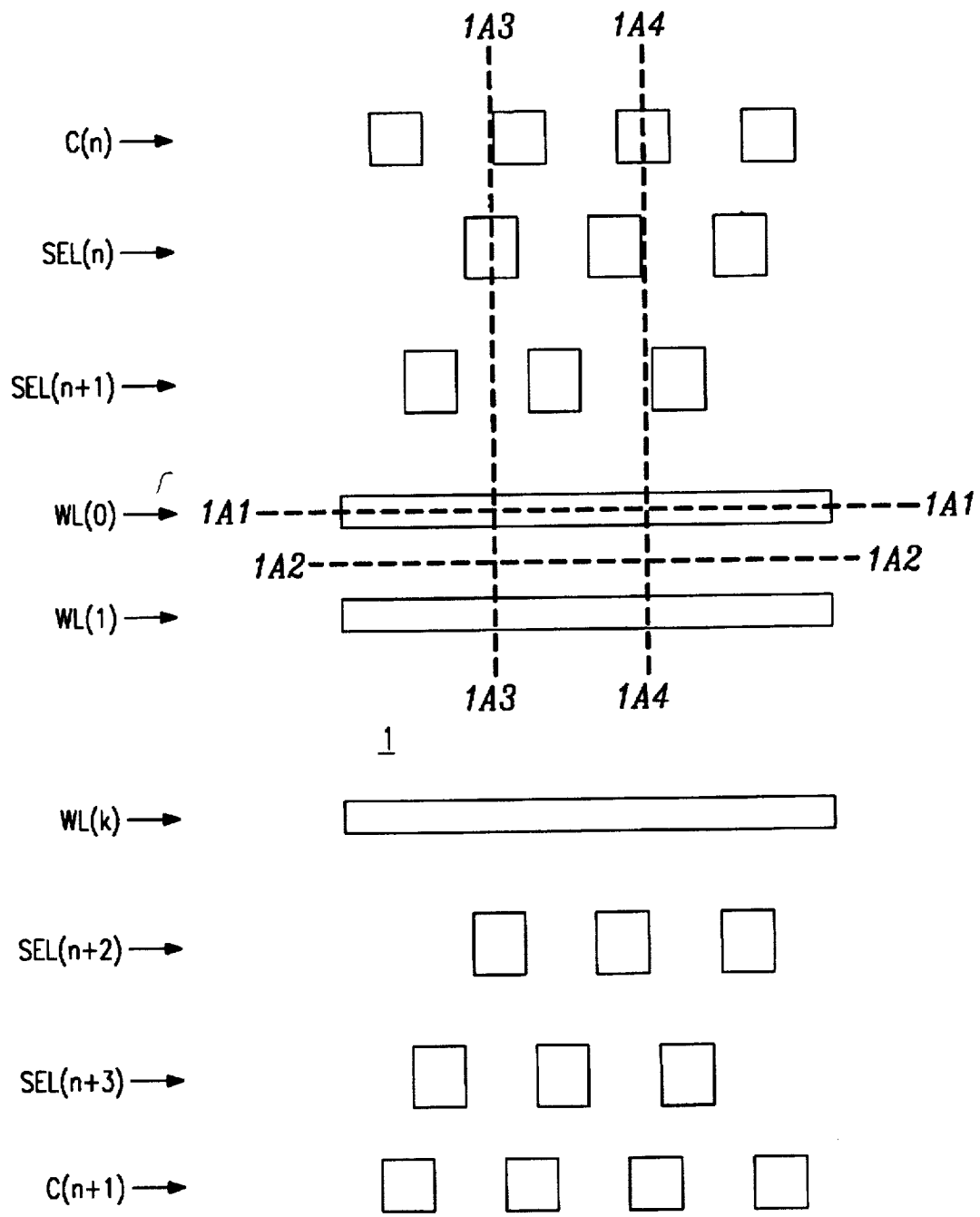

With reference to FIGS. 1, 1A1–1A4 and 1B1–1B4, the whole semiconducting substrate 1 which, as shown, may be constituted by an epitaxial layer of doped silicon having a p-type conductivity, is subjected to thermal oxidation in order to grow a thin layer of so-called "pad" oxide 2 whose thickness may be comprised between 10 and 20 nm and in any case such as to sufficiently protect the semiconducting substrate during the following steps of the process. Above the pad oxide layer 2, a silicon nitride layer 3 is deposited with a thickness of about 150 nm and above the deposited silicon nitride layer 3 a photoresist mask (not shown) is formed for defining the areas where a relatively thick field oxide layer will be grown, i.e. all around the active areas which are indicated in FIG. 1 and in all other plan layout views (layout) by a perimeter drawn with a continuous line. As may be observed in FIG. 1, in the area occupied by the matrix of cells, active areas in the form of horizontal parallel strips are defined in a predefined number (k) which will correspond to a predefined number of wordlines. Therefore, each group of wordlines (WL(0)–WL(k)) is separated from an eventual other group formed above or below the group depicted in the fragmentary layout view of FIG. 1, by two rows of offset, insular, active areas into which select transistors will be formed for establishing a connection between a continuous bitline contacted to a metal line and a discontinuous or interrupted bitline, adjacent thereto, and by a third row of insular areas on which will be formed the contacts of the continuous bitlines contacted directly with a metal line.

In the areas left unmasked by the nitride layer 3, a layer of field oxide 4 is thermally grown until it reaches a thickness of about 600 nm. The nitride layer constitutes an oxygen impervious mask for growing the field oxide 4.

Figure 2:
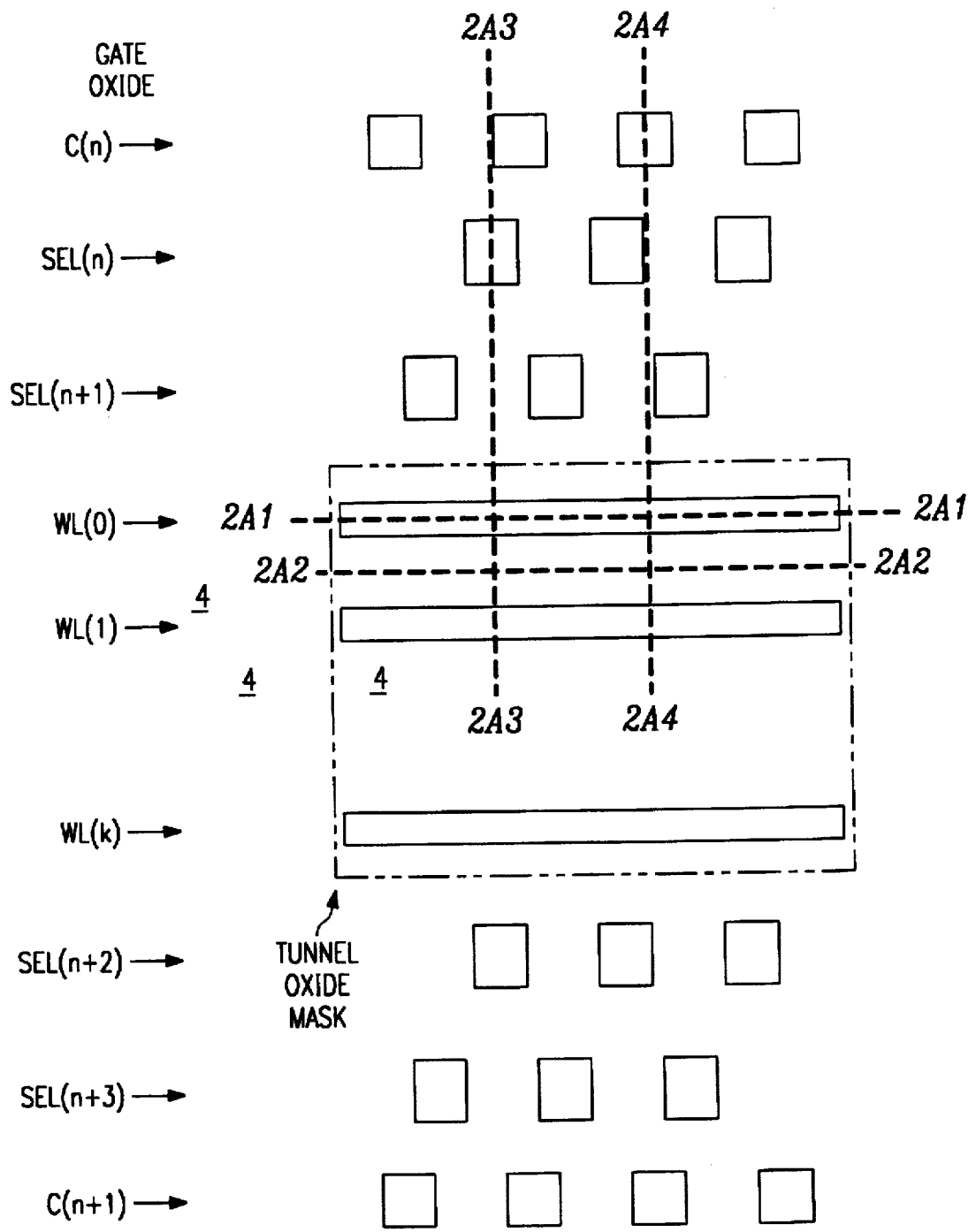
Figure 3:
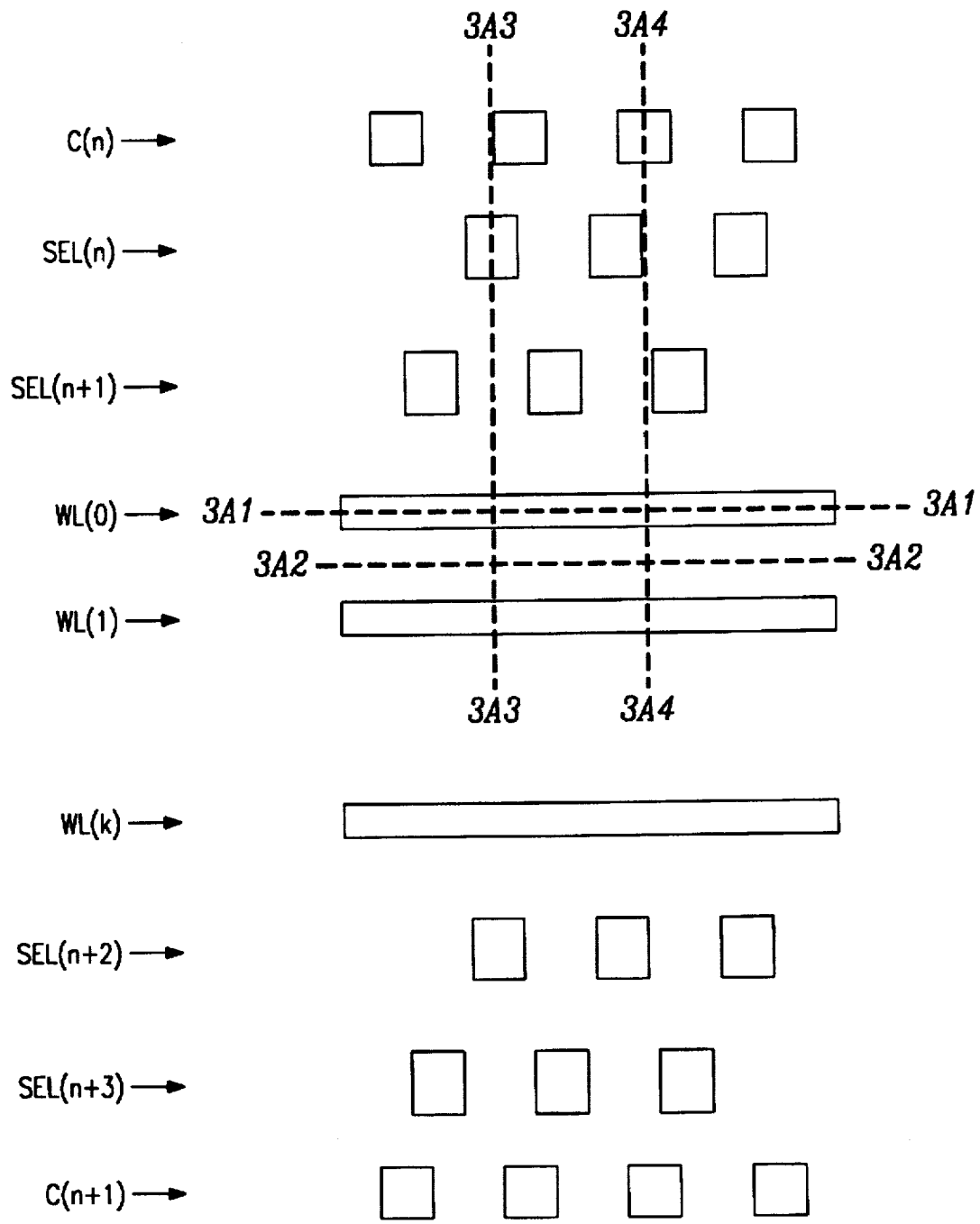

By referring to FIGS. 2, 2A and 2B, after having removed the residual portions of the nitride layer 3 and of the pad oxide layer 2 from the active areas defined by the completed growth of the field oxide structure 4, a new cycle of thermal oxidation is carried out to form a layer of sacrificial oxide (having a thickness which may be comprised between 30 and 50 nm), and then it is etched away. Subsequently, a partial growth of a gate oxide layer is performed in the cells' area, on the cell areas of the matrix, on the insular areas of the select transistors (cell) as well as of the transistors of the external circuitry (not shown in the figures), for a thickness which, in this first phase of growth, may be comprised between 10 and 20 nm. A mask R1 is formed thereafter, the aperture of which is indicated in FIG. 2 by means of the perimeter drawn with a dashed line and identified by the arrow and by the label: TUNNEL OXIDE MASK, which masks all the active areas which do not belong to the memory cells of the matrix. Through this photoresist mask R1, the gate oxide which was partially grown in the active areas of the memory cells is etched and boron is implanted for modifying in the desired manner the doping level of the channel region of the cells. Therefore this implantation of the active channel area of the matrix's cells is performed in a self aligned manner through slits of the field oxide 4. Boron implantation may be carried out at an energy level of about 60–80 KeV, for a dose of about $4-60 \cdot 10^{12}$ atoms/cm$^2$. In FIGS. 2A1–2A4 and 2B1–2B4 this implantation is depicted by the arrows $B^{11}$.

With reference to FIGS. 3, 3A1–3A4 and 3B1–3B4, after having implanted the matrix's cell areas, the photoresist mask R1 is removed and the wafer is subjected to an oxidation cycle for growing a layer of tunnel oxide on the semiconducting single crystal in the active areas of the matrix's memory cells, from where the partially grown gate oxide layer previously formed had been removed, for a thickness which may be comprised between about 9 and about 12 nm. With this new cycle of oxidation the gate oxide layer which was already partially grown on the active areas of the select transistors and of the transistors of the external circuitry, reaches practically a definitive thickness of about 20 nm.

Thereafter, a stack is formed, which is composed of: a first deposited layer 7 of polysilicon; an interpoly isolating multilayer, which may be formed by a layer of oxide, a deposited layer of silicon nitride and an oxide layer obtained by oxidizing the deposited nitride and which is commonly known by the acronym ONO (Oxide-Nitride-Oxide), identified as a whole as 8 in the figures and having a total equivalent thickness of about 20 nm; a protective deposited layer 9 of polycrystalline silicon (dummy polysilicon) having a thickness between about 100 and about 150 nm; and finally a deposited layer 10 of silicon nitride having a thickness between 20 and 30 nm. The first layer of polysilicon 7 may be doped in situ by use of POCl$_3$ or by implantation, and from this layer the floating gate of the memory cell as well as the gate structures of the select transistors (SEL) and of the transistors of the external circuitry will be patterned eventually. The second layer 9 of polysilicon has the purpose of protecting the thin isolating ONO multilayer 8 during the subsequent steps of the process, while the uppermost layer 10 of silicon nitride has the function of protecting in turn the layer of polysilicon 9 during the subsequent oxidizing treatments.

Figure 4:
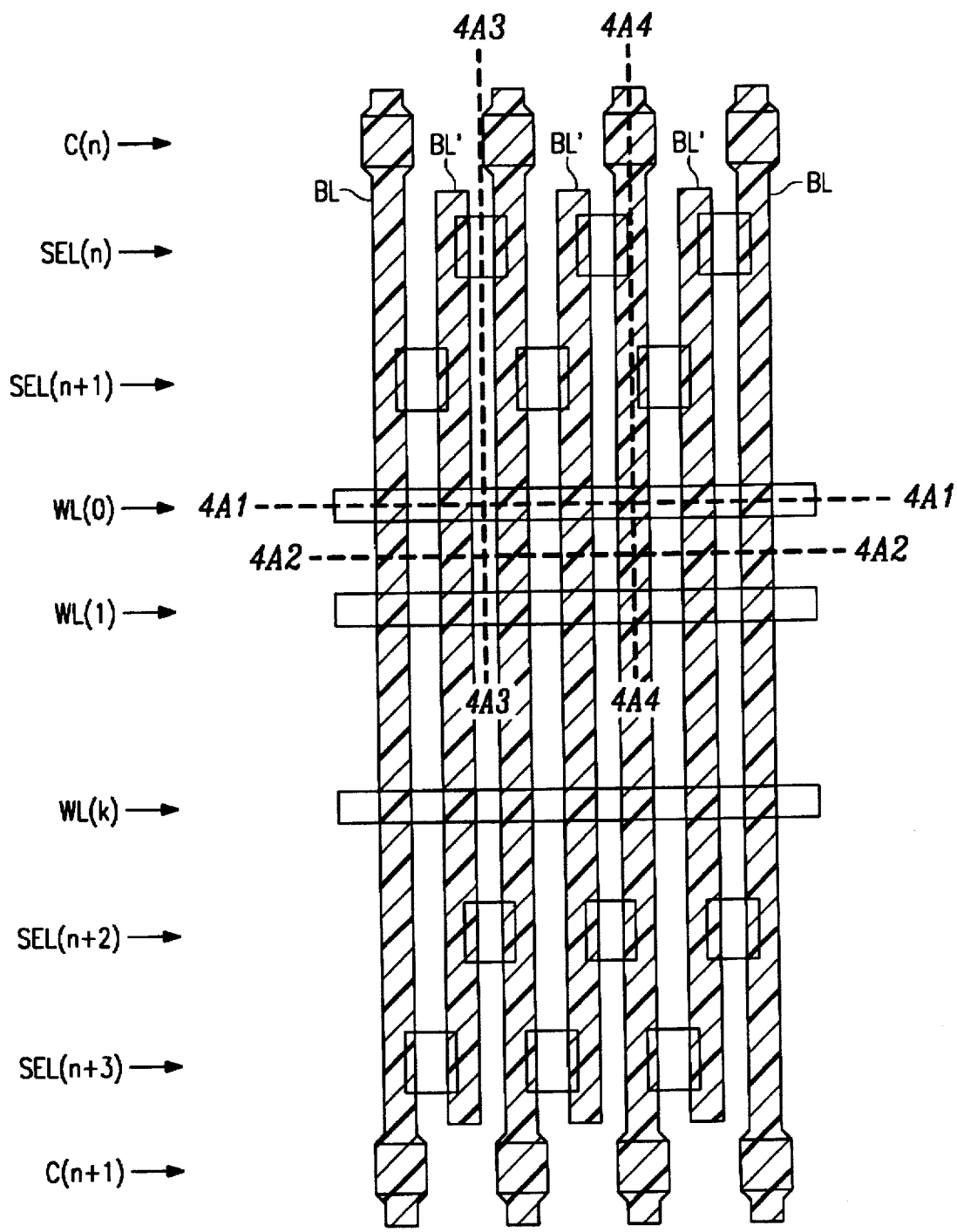
Figure 5:
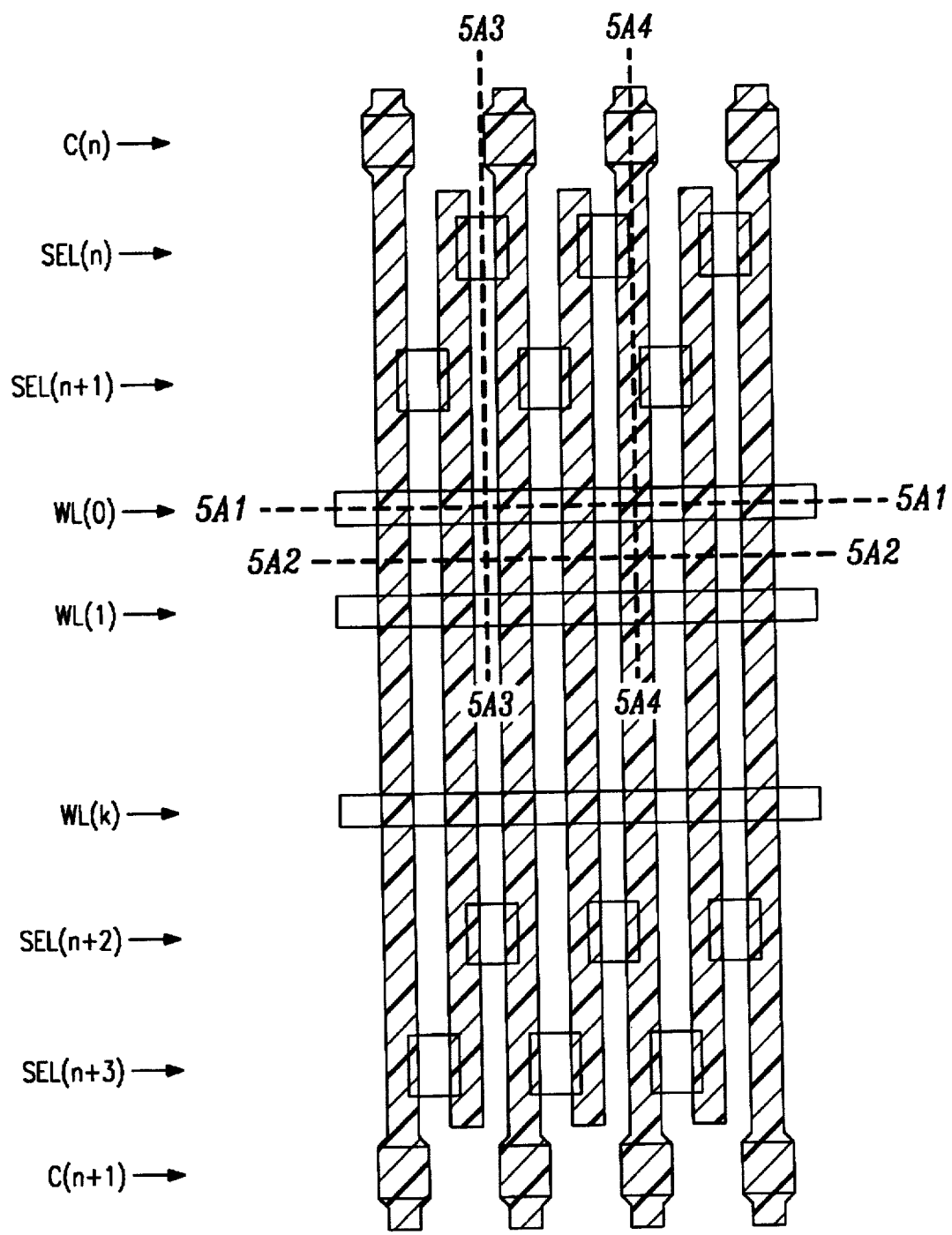

With reference to FIGS. 4, 4A1–4A4 and 4B1–4B4, the process continues with the formation of an R2 mask for defining the first layer of polysilicon and with the etch of the multilayered 6–10 stack and of the field oxide 4. Through this etching step the bitlines which intersect the active areas previously defined are formed, by crossing within the memory cell area the horizontal parallel strips which will coincide with the wordlines. The bitlines are defined alternately as continuous strips BL and as interrupted strips (BL') (FIG. 4). Eventually the continuous bitlines (BL) will be contacted directly by a metal line, through contacts formed in the prearranged areas C(n) etc., while the interrupted bitlines BL' will be contacted through select transistors SEL). After having "opened" the bitlines, a heavy implantation with an N-type dopant (arsenic and/or phosphorous) is made for forming the diffused bitlines in the p-type semiconducting substrate, as well as the source/drain junctions of the memory cells and of the select transistors (SEL). In view of the fact that the mask for defining the polysilicon of the first level practically leaves the said stack on all the other areas except along the bitline strips, it is not necessary to introduce in the fabrication process a special mask for this implantation. The implantation, for example with arsenic, may be carried out with an energy of about 35 KeV and for a dose of about $3-6 \cdot 10^{15}$ atoms/cm$^2$.

At this point of the process, it is possible to introduce a special mask and effect differentiated implantation steps in order to form LDD source junctions (Lightly Doped Drain extensions) which are necessary for forming electrically, source-erasable cells (i.e. for fabricating FLASH-EPROM memories). Such an additional mask is not depicted in the figures but its profile can be easily visualized by a skilled technician. Normally, after an arsenic implantation on the source and drain areas and through said other mask masking the drain areas, phosphorous is implanted in the source areas, which, by virtue of a greater diffusivity as compared to arsenic, will diffuse beyond the diffusion profile of arsenic thus giving to the junction a graduated profile. This enables the source junction to tolerate the high voltages which are necessary for erasing a cell by a tunnelling mechanism. According to an architecture of a normal gate-erasable EPROM or FLASH-EPROM memory, the continous bitlines SL, contacted in metal, preferably coincide with the drain areas of the memory cells, while the interrupted bitlines BL', which are contacted through respective select transistors, peferably coincide with the source areas of the memory cells. By contrast, when a source-erasable FLASH-EPROM memory must be fabricated and therefore a double diffusion of the source junction is required. The continuous bitlines BL, which are contacted in metal, are made to coincide preferably with the source regions of the cells, while the interrupted bitlines BL', which are contacted through respective select transistors, are made to coincide with the drain regions of the cells. Therefore, the additional mask which is used for effecting the further implantation of the source areas will have a profile such as to mask the interrupted bitlines (BL') and will have openings which expose the continuous bitlines BL.

With reference to FIGS. 5, 5A1–5A4 and 5B1–5B5, the mask used for defining the polysilicon of first level, and which is used also for implanting the bitlines, is removed. An oxidation step is performed until an oxide layer with a relatively large thickness (from 50 to about 100 nm) is grown over the areas implanted during the preceding step. Simultaneously, the implanted species diffuse in the semiconducting substrate, as indicated in FIGS. 5A1–5A4 and 5B1–5B4. The oxide layer 11, grown during this oxidation treatment, will have a thickness which is limited only by the requirement of not excessively diffusing the bitline junction.

At this point, a first planarization step of the surface of the wafers being fabricated is performed by first depositing a layer 12 of planarizing dielectric material and subsequently by etching the deposited layer 12 until exposing the second layer 9 of polysilicon (dummy polysilicon), thus eliminating also the protective layer of silicon nitride 10. This planarization step has the purpose not only of facilitating the subsequent masking steps but also of diminishing parasitic capacitive couplings between bitlines and wordlines by increasing the separation distance therebetween, thus overall improving the speed characteristics of the memory.

Figure 6:
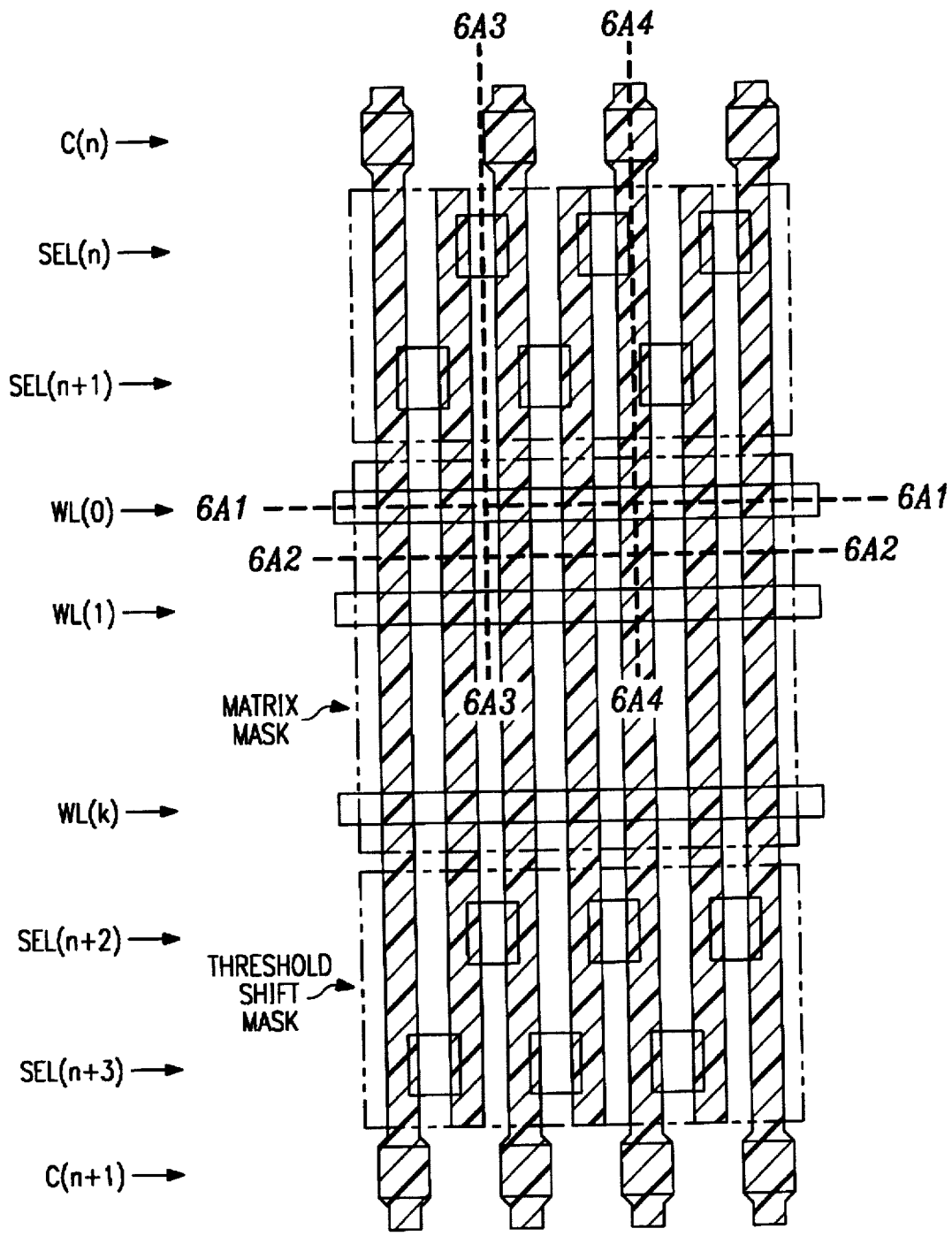
Figure 7:
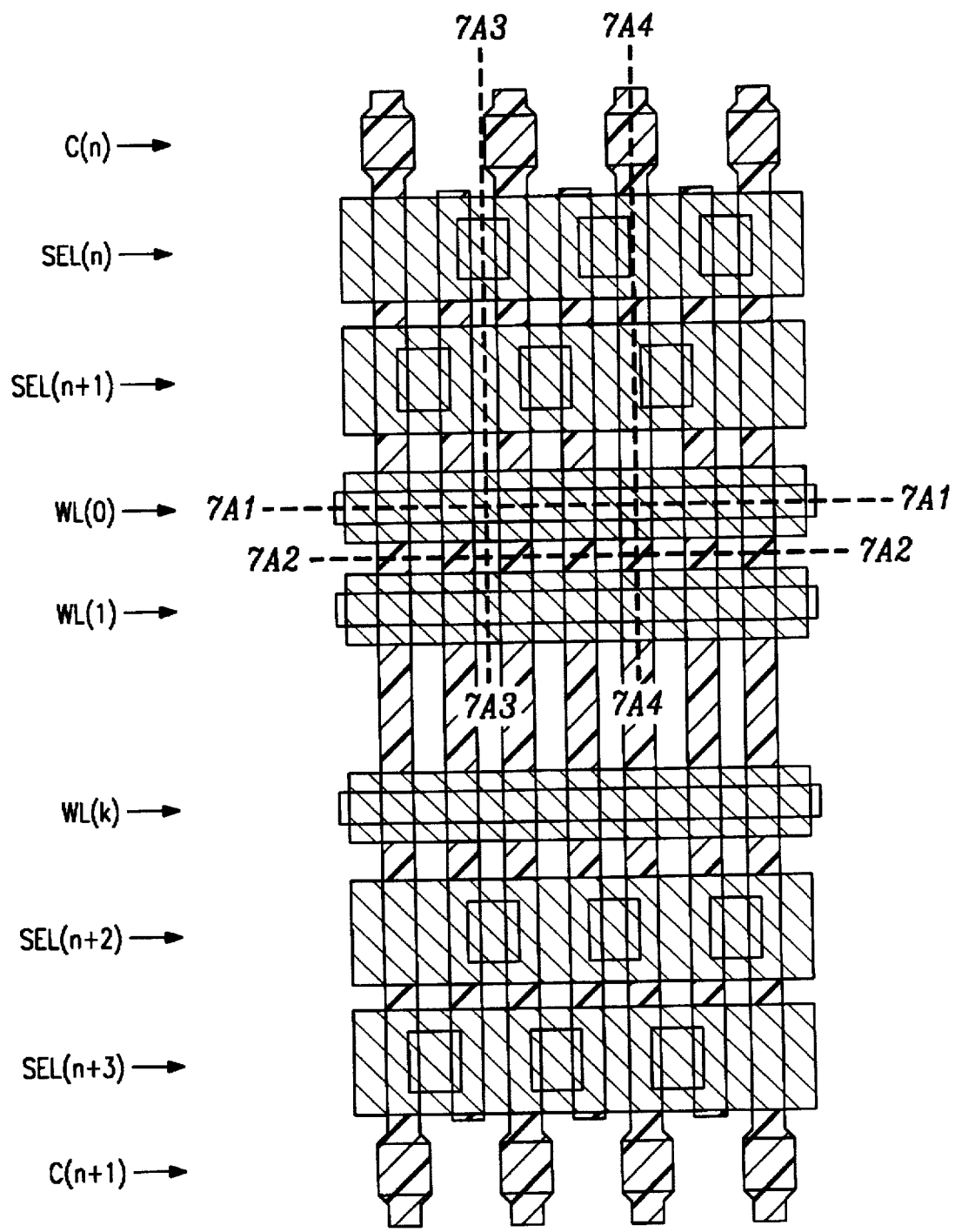

With reference to FIGS. 6, 6A1–6A4 and 6B1–6B4, above the planarized surface, a M3 mask (MATRIX) is formed, through which mask the second polysilicon layer 9 (dummy polysilicon) and the underlying ONO multilayer 8 are etched off from all the areas outside the area occupied by the matrix of memory cells, and also from the areas of the select transistors (SEL) and the area of the external circuitry. Through this M3 mask (MATRIX), a boron implantation for threshold adjustment may be effected in the channel areas of the select transistors (SEL) and of the transistors of the external circuitry, in the case where all these transistors require the same type of implant. Otherwise it is possible to use a dedicated mask, THRESHOLD SHIFT MASK, the openings of which are indicated in FIG. 6 by the squares drawn with dash and point line, while the perimeter of said MATRIX mask is indicated in the same FIG. 6 by the perimeter drawn with a dashed line. Such a boron implantation for adjusting the threshold of select and external circuitry transistors is carried out, as indicated by the arrows in FIG. 6B3, through the layer 7 of polysilicon of first level and the underlying gate oxide layer 5. In a sample embodiment, the implant conditions may be: energy 50 KeV, dose $1 \cdot 10^{12}$ atoms/cm$^2$.

With reference to FIGS. 7, 7A1–7A4 and 7B1–7B4, at this point of the process, after having implanted the active areas and the bitlines and after having isolated the bitlines, a layer 13 of second level polysilicon having a thickness of about 100 nm is deposited and doped, and thereafter a layer 14 of tungsten silicide having a thickness of about 250 nm is deposited over the second level polysilicon in order to increase the conductivity of the wordlines of the memory which will be patterned in this conducting stack, thus reducing the time constant RC affecting propagation of address signals through the memory matrix. Thereafter, a mask M4 for defining the second level polysilicon is formed, and used to define the gates of the external circuitry and of the select transistors (SEL), as well as the wordlines of the memory cells (control gates) are defined. The etching of the polysilicon 13 is arrested eventually either on the field oxide 4 or on the planarization dielectric 12 in peripheral external areas, while in the area occupied by the matrix of memory cells, the etching is arrested on the ONO interpoly dielectric multilayer 8.

Figure 8:
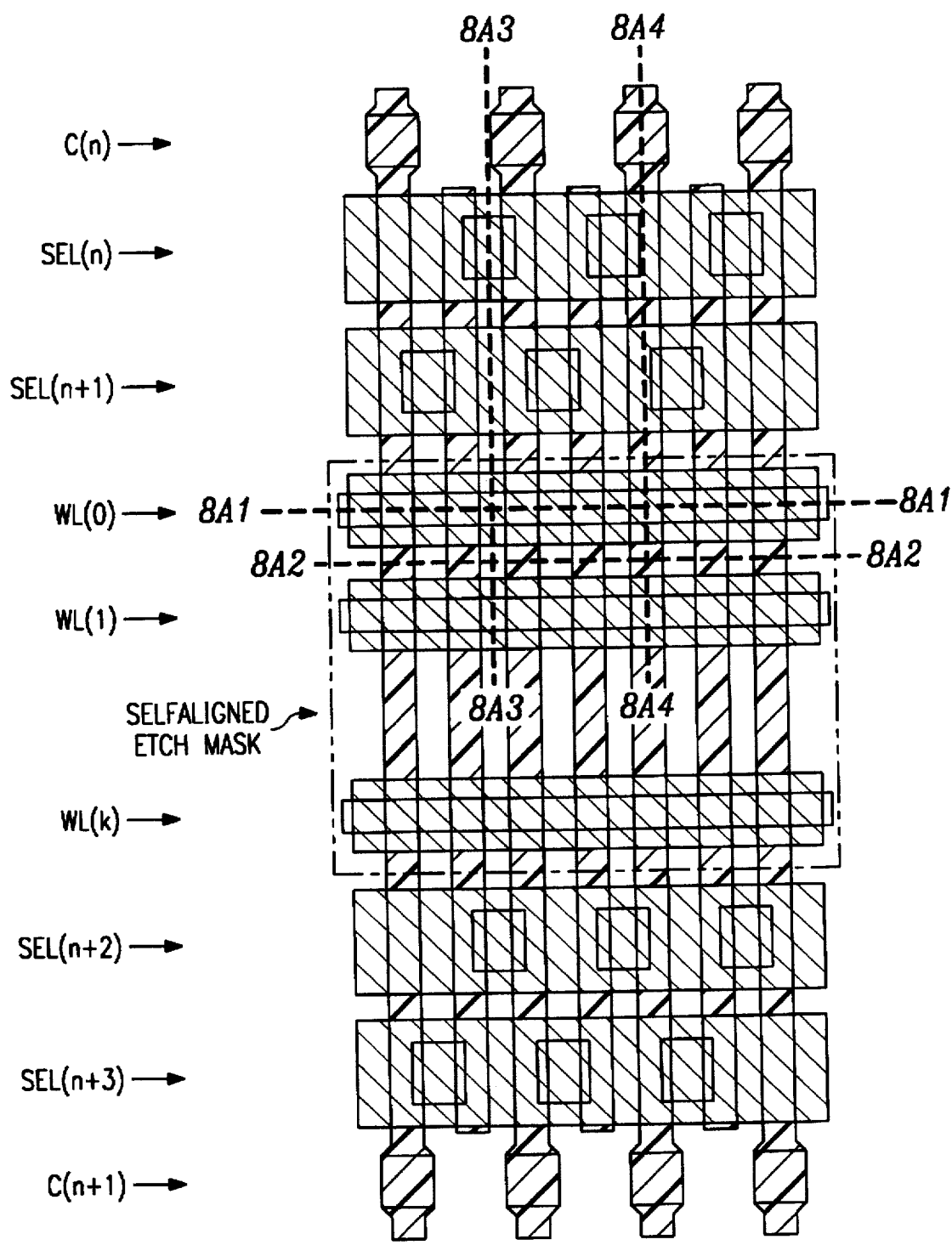

With reference to FIGS. 8, 8A1–8A4 and 8B1–8B4, the process of fabrication proceeds with the formation of a mask M5 for a self-aligned etching pertaining solely to the area occupied by the memory cells, as depicted by the perimeter drawn with a dash line and labelled SELF ALIGNED ETCH MASK of FIG. 8, which identifies an opening of the mask. This mask is used for defining and separating the floating gates of single cells aligned along a same column of the matrix.

Through this mask, the ONO stack 8 and the polysilicon of first level 7 are etched in a selfaligned manner. Etching is arrested on the field oxide 4, thus determining a partial superimposition of the gate structure of the cells over the adjacent edges of the field oxide, for achieving a sufficient capacitive coupling. From this point on, the process of fabrication of the whole integrated circuit may proceed in a standard manner by defining the n-type and p-type junctions of the external circuitry. These further steps of a standard CMOS process do not pertain to the array of memory cells and of the select transistors (SEL) and therefore are not illustrated and described. At the end of these other steps of a CMOS fabrication process, a new cycle of planarization is performed by depositing a layer of planarizing dielectric material 15 and subsequently carrying out a blanket etching step.

Figure 9:
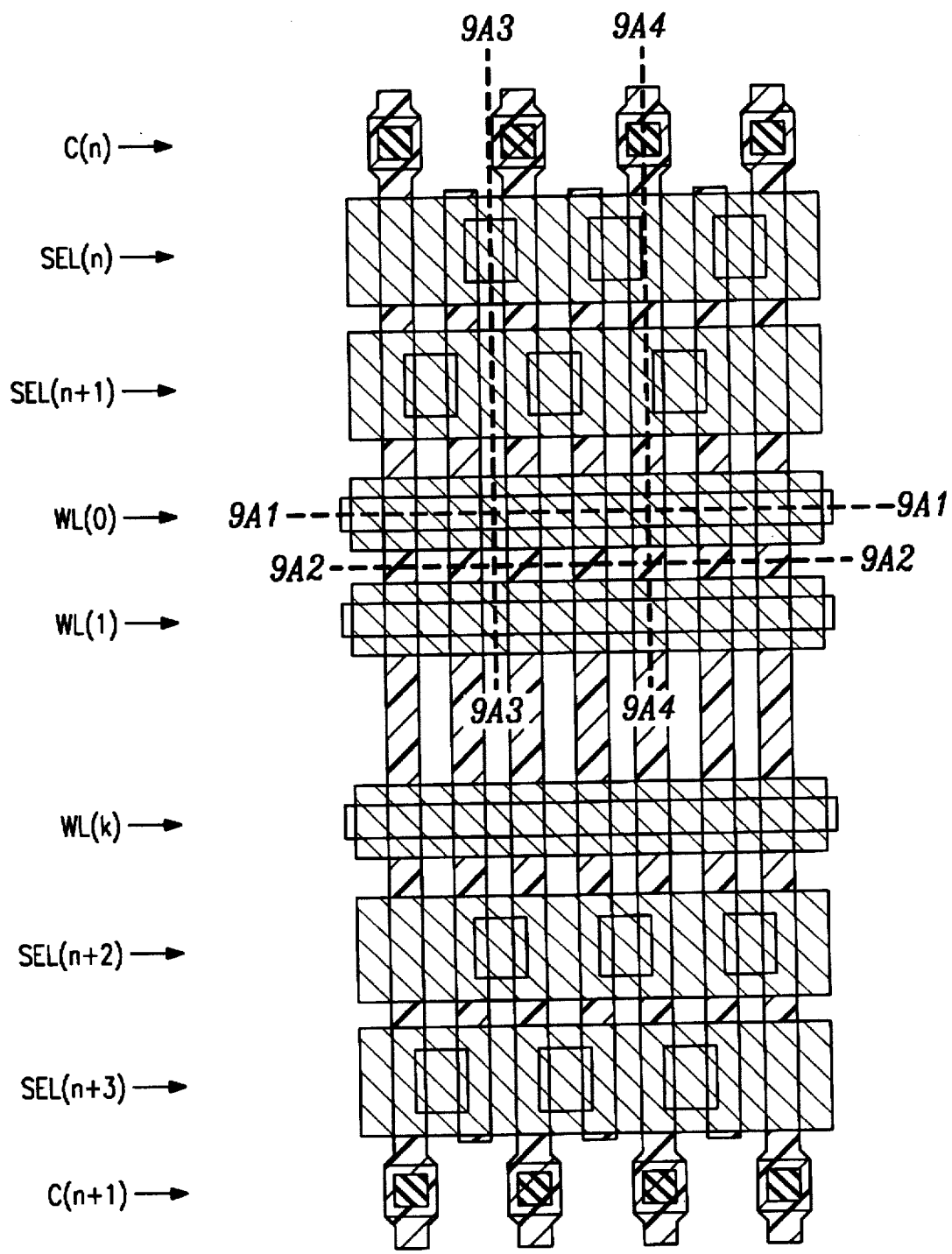

With reference to FIGS. 9, 9A1–9A4 and 9B1–9B4, the process proceeds with the deposition of an intermediate dielectric layer 16, with the formation of a contact-opening mask M6 and with the etching of the whole dielectric layer until exposing the silicon in the contact areas (C) of continuous bitlines (BL) (FIG. 9B).

As depicted in FIGS. 10, 10A1–10A4 and 10B1–10B4, deposition of metallic plugs 17 in the contact holes and of a metal layer 18 (FIG. 10A) follows. A further mask for defining the metal 18 is formed and the metal is etched.

Figure 10:
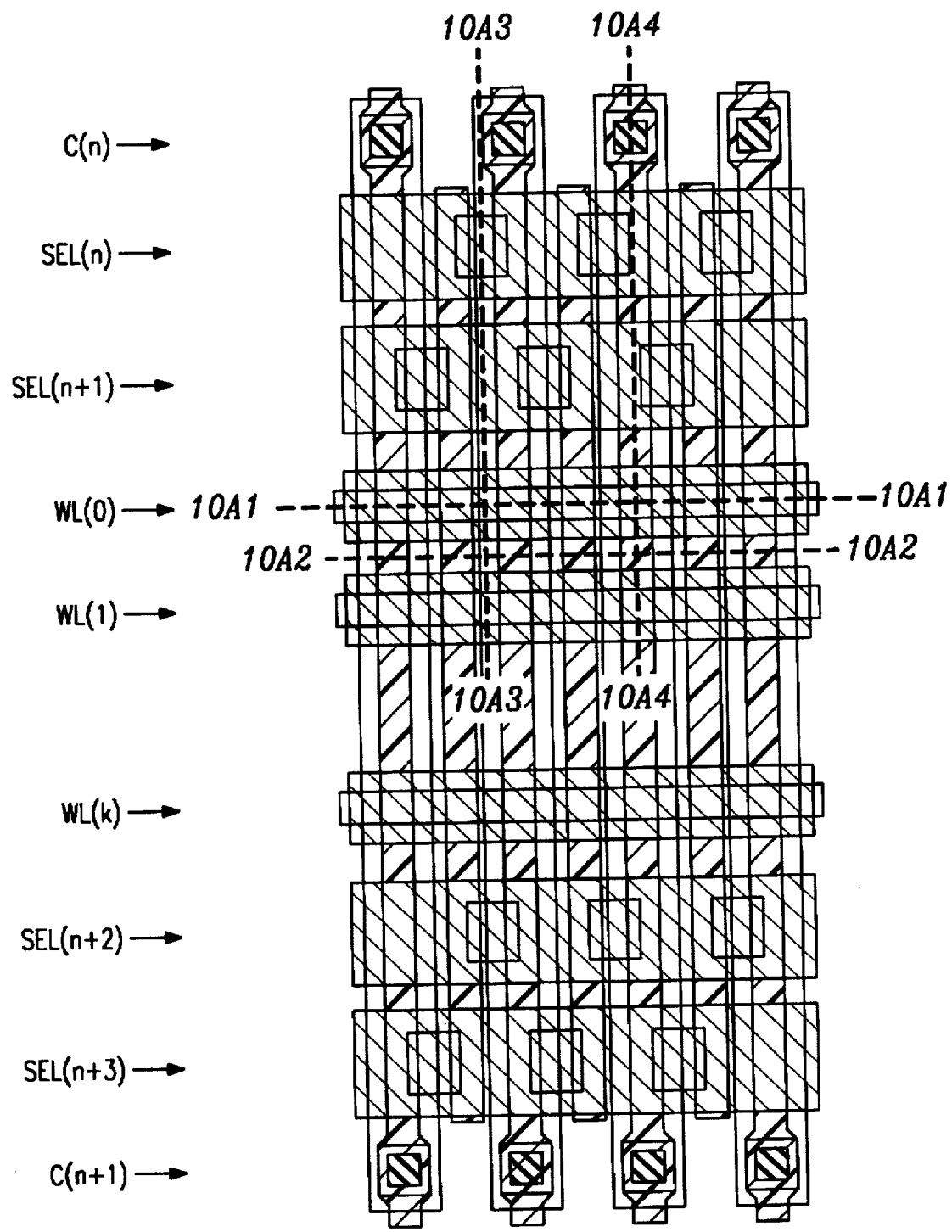

FIG. 10 depicts the layout of the memory cells.

An alternative embodiment of the process of the invention is depicted in the series of Figures starting from FIG. 3bis to FIG. 9bis. The fundamental difference between the two embodiments consists in the mask used for defining the polysilicon of the first level. While in the described first embodiment slits coinciding with the diffused memory bitlines to be formed were defined, according to the following alternative embodiment, parallel strips of polysilicon of first level are defined which will originate the floating gates of the cells.

The fabrication process according to this alternative embodiment remains identical to the process already described for the first steps until the growth of a tunnel oxide layer with a thickness between 9 and 12 nm. Thereafter, as shown in FIGS. 3bisB1–3bisB4, differently from the process described before, a first layer of polysilicon 7 is deposited and above the deposited layer of polysilicon 7, an interpoly dielectric ONO multilayer 8 is formed.

With reference to FIGS. 4bis, 4bisA1–4bisA4 and 4bisB1–4bisB4, a mask R2bis is formed for defining the polysilicon of first level and through this mask the stack 6–8 and the field oxide 4 are also etched. As shown in light field in the plan view of FIG. 4bis, these steps define strips of polysilicon between which the future bitline will be formed, alternately, in a continuous form (BL) and in an interrupted form (BL'). Of course also in this case, the future continuous bitlines BL will be contacted directly in metal through a plurality of spaced contacts which will be formed in the prearranged areas (C(n), C(n+1), etc.), while the interrupted bitlines BL' will be contacted through respective select transistors (SEL).

A new mask (not shown in the figures) is formed thereafter for masking the area external to the area occupied by the memory cells and the select transistors (SEL), for implanting the bitlines with a heavy dose of an n-type dopant (arsenic and/or phosphorous), in order to form bitlines diffused in the p-type semiconducting substrate as well as the source/drain junctions of the memory cells and of the select transistors (SEL). This mask was not necessary in the process of the first embodiment and therefore this alternative embodiment will require one additional mask. Of course, also in this case, when an electrically erasable memory (FLASH-EPROM or EEPROM) must be fabricated, a dedicated additional mask will be introduced in the process of fabrication as well as a second implantation step in order to obtain graduated source junctions, as described before.

With reference to FIGS. 5bis, 5bisA1–5bisA4 and 5bisB1–5bisB4, an M3 mask (MATRIX) is formed for removing the dielectric ONO multilayer 8, the polysilicon of first level 7 and the gate oxide layer 5 from the areas of the select transistors (SEL) and of the external circuitry.

After having removed the MATRIX mask, an oxidation of the implanted bitlines, and a new growth of gate oxide 5 to a thickness which indicatively may be between 15 and 25 nm in the active areas of the select transistors (SEL) and of the external circuitry, is performed. According to this second embodiment of the process of the invention, the thickness of the oxide grown on the diffused bitlines is substantially limited to the thickness of the gate oxide typical of the particular CMOS process used.

With reference to FIGS. 6bis, 6bisA and 6bisB, a mask M3 is formed for carrying out a threshold adjustment implantation, by implanting boron through the gate oxide which was formed during the preceding step in the channel areas of the select transistors (SEL) and of the transistors of the external circuitry.

After having removed the M3' mask, a polysilicon layer of second level 13 is deposited and doped. Thereafter, a layer of tungsten silicide 14 is deposited.

With reference to FIGS. 7bis, 7bisA1–7bisA4 and 7bisB1–7bisB4, a mask M4 is formed for defining the polysilicon of second level, thus defining also the gates of the external circuitry, of the select transistors (SEL) and the wordlines (control gates) of the memory cells. The etching of the polysilicon is arrested on the field oxide 4 or on the gate oxide layer 5 grown on the diffused bitlines, except in the area occupied by the memory cells where it is arrested on the ONO multilayer layer 8.

A mask M5 pertaining only to the area occupied by the memory cells is formed for conducting a self-aligned etching step. Through this mask, the floating gates of the individual cells are defined and separated from each other, by etching the ONO layer 8 and the polysilicon of first level 7.

With reference to FIGS. 8bis, 8bisA1–8bisA4 and 8bisB1–8bisB4, the fabrication process may then continue according to a standard CMOS sequence. N-type and p-type junctions of the external circuitry (not shown in the figures) are defined and implanted, a planarization step is performed and an intermediate dielectric layer 16 is deposited, as already described. Similarly, a contact mask M6 is formed and the contacts are opened.

In FIG. 9bis, 9bisA1–9bisA4 and 9bisB1–9bisB4 the deposition of metallic plugs 17 in the contacts and of the metal layer 18 is shown. FIG. 9bisB depicts the formation of the mask M7 for defining the metal and the subsequent etching of the metal layer 18.

FIG. 9bis shows the layout of the memory cells as produced by this alternative embodiment of the process of the invention.

Figure 11:
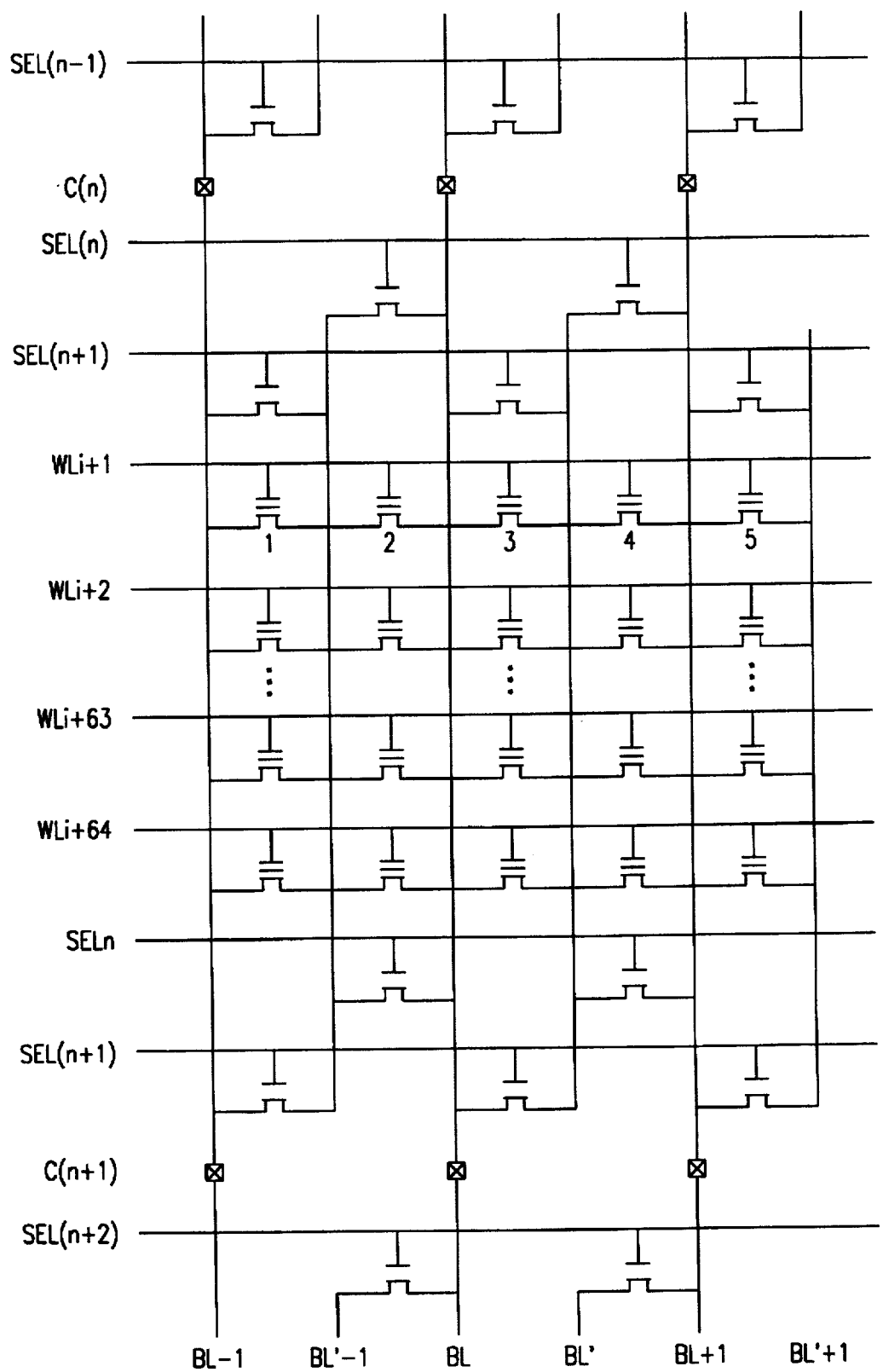
FIG. 11 shows a functional circuit diagram of a contactless memory which may be fabricated with the process of the invention.

A functional diagram of an EPROM memory array which can be fabricated by the process of the invention is depicted in FIG. 11. The operation of the memory circuit is similar to that of the memory array described in the cited article: "Alternate Metal Virtual Ground (AMG)—A New Scaling Concept for Very High-Density EPROM'," by Boaz Eitan, 12 IEEE Electron Devine Letters pp. 450ff (August 1991), which is herein incorporated by reference.

The improved fabrication process of the invention employs relatively non-critical masks and permits the fabrication of high density electrically programmable and erasable (EEPROM or FLASH-EPROM) devices. In practice, the novel process permits the fabrication of a contactless type, cross-point cell definition, memory matrix which provides for a more comfortable "pitch" of bitline metal-definition while, on the other hand, realizes a cell layout characterized by a gate structure extending laterally over adjacent portions of field oxide, thus establishing an appropriate capacitive coupling between control and floating gates.

What is claimed is:

1. A product made by the process of fabricating a matrix of floating gate memory cells organized in rows and columns, with bitlines in the form of diffused regions alternately continuous and contacted directly through a metal line and discontinuous and contacted through respective select transistors arranged along at least two rows of offset select transistors every certain number of rows of matrix's memory cells, on a semiconducting substrate having a first type of conductivity and comprising the steps of:

forming a pad oxide layer on said substrate, depositing and defining a masking nitride layer;

forming a field oxide defining channel regions of said cells in the form of parallel strips oriented along a first direction and rows of offset insular areas of said select transistors and of said contacts of said continuous bitlines;

removing said masking nitride and said pad oxide;

thermally growing a layer of gate oxide having a certain partial thickness over said channel regions and said insular areas defined by the field oxide;

defining by masking the area of said matrix of memory cells, etching said gate oxide and implanting a dopant of said first type of conductivity in said channel areas of the memory cells and removing said mask and growing a layer of tunnel oxide having a thickness smaller than the partial thickness of said removed gate oxide layer, while increasing the thickness of said gate oxide layer in other areas;

depositing a layer of polycrystalline silicon of first level and doping the polycrystalline silicon for increasing electrical conductivity to a desired value, forming an interpoly insulating multilayer, depositing a protective layer of polycrystalline silicon over said interpoly insulating multilayer and depositing a layer of silicon nitride having a thickness capable of protecting from oxidation the said protective layer of polycrystalline silicon; masking said silicon nitride layer;

etching said silicon nitride layer said protective polycrystalline silicon layer, said interpoly isolation multilayer, said doped polycrystalline silicon layer of first level, said gate or tunnel oxide and said field oxide at crossings until exposing said semiconducting substrate along a plurality of alternately continuous and interrupted strips parallel to each other and oriented orthogonally in respect to underlying strips of field oxide defining said strip-shaped channel regions, within the area occupied by said matrix of cells;

implanting a heavy dose of a dopant capable of producing a second type of conductivity in exposed areas of said semiconducting substrate within said matrix area to form matrix's diffused bitlines, each coinciding either with source or with drain regions of a second type of conductivity of memory cells arranged along a same column;

diffusing said implanted dopant and oxidizing the surface of said semiconducting substrate in said areas exposed and implanted during the preceding steps while maintaining the other areas external to the area occupied by the memory cells protected from oxidation by said protecting silicon nitride layer;

planarizing the surface by depositing a planarizing layer of dielectric material and continuing the etching to remove said silicon nitride layer and exposing said protection layer of polycrystalline silicon;

masking the area occupied by said memory cells and eliminating said protective polysilicon silicon layer and said interpoly isolation multilayer from all the areas external to said area;

implanting a dopant of said first type of conductivity for adjusting the threshold in the channel areas of said select transistors and of transistors of circuits external to the matrix of memory cells, through said doped polycrystalline silicon layer of first level and said gate oxide layer;

depositing and doping a layer of polycrystalline silicon of second level;

depositing a layer of tungsten silicide;

masking said tungsten silicide layer to define the gate of transistors of said external circuits as well as of said select transistors and the control gates of said matrix of memory cells in the form of parallel strips oriented in said first direction;

etching said tungsten silicide layer and said doped polycrystalline silicon layer of second level, arresting the etching on said field oxide or on said planarizing dielectric material in areas external to the area of said matrix of memory cells and on said interpoly isolation multilayer within the matrix's area;

masking the areas external to said matrix area;

performing a self-aligned etching of said interpoly isolation multilayer and of said doped polysilicon layer of first level within said matrix's area;

forming a plurality of contacts on each of said continuous bitlines disposed alternately to said interrupted bitlines and depositing and defining parallel lines of a metallization layer over each of said plurality of contacts of said continuous bitlines.

2. A product made by the process of fabricating a matrix of memory cells having a floating gate organized in rows and columns, with bitlines in the form of diffused regions alternately continuous and contacted directly through a metal line and discontinuous and contacted through respective select transistors arranged along at least two rows of offset cells every certain number of rows of matrix's memory cells, on a semiconducting substrate having a first type of conductivity and comprising the steps of:

forming an pad oxide layer on said substrate, depositing and defining a masking nitride layer;

forming a field oxide defining channel regions of said cells in the form of parallel strips oriented along a first direction and rows of offset insular areas of said select transistors and of said contacts of said continuous bitlines;

removing said masking nitride and said pad oxide;

thermally growing a layer of gate oxide over said channel regions and said insular areas defined by the field oxide;

defining by masking the area of said matrix of memory cells, etching said gate oxide and implanting a dopant of said first type of conductivity in said channel areas of the memory cells and removing said mask and growing a layer of tunnel oxide having a thickness smaller than the thickness of said removed gate oxide layer;

depositing a layer of polycrystalline silicon of first level and doping the polycrystalline silicon for increasing electrical conductivity to a desired value, forming a interpoly insulating multilayer;

masking said interpoly insulating multilayer;

etching said interpoly isolation multilayer, said doped polycrystalline silicon layer of first level, said gate or tunnel oxide and said field oxide at crossings until exposing said semiconducting substrate along a plurality of alternately continuous and interrupted strips parallel to each other and oriented orthogonally in respect to underlying strips of field oxide defining said strip-shaped channel regions, within the area occupied by said matrix of cells and leaving strips of said interpoly multilayer and doped polycrystalline silicon of first level in the matrix's area;

masking areas external to the matrix's area and implanting a heavy dose of a dopant capable of producing a second type of conductivity in exposed areas of said semiconducting substrate within said matrix area to form matrix's bitlines, each coinciding either with source or with drain regions of a second type of conductivity of memory cells arranged along a same column;

diffusing said implanted dopant and oxidizing the surface of said semiconducting substrate in said areas exposed and implanted during the preceding steps and forming again a gate oxide layer in the areas of said select transistors and of external circuits;

masking the matrix's area and etching said interpoly insulating multilayer, said doped polycrystalline silicon of first level and said gate oxide and removing said mask;

masking the area occupied by said memory cells and implanting a dopant of said first type of conductivity for adjusting the threshold in the channel areas of said select transistors and of transistors of circuits external to the matrix of memory cells, through said reformed gate oxide layer;

depositing and doping a layer of polycrystalline silicon of second level;

depositing a layer of tungsten silicide;

masking said tungsten silicide layer to define the gate of transistors of said external circuits as well as of said select transistors and the control gates of said matrix of memory cells in the form of parallel strips oriented in said first direction;

etching said tungsten silicide layer and said doped polycrystalline silicon layer of second level arresting the etching on said field oxide in areas external to the area of said matrix of memory cells and on said interpoly isolation multilayer within the matrix's area;

masking the areas external to said matrix area;

performing a self aligned etching of said interpoly isolation multilayer and of said doped polysilicon layer of first level within said matrix's area;

planarizing the surface by depositing a layer of planarizing dielectric material followed by etching and depositing an intermediate isolation dielectric layer;

forming a plurality of contacts on each of said continuous bitlines disposed alternately to said interrupted bitlines and depositing and defining parallel lines of a metallization layer over each of said plurality of contacts of said continuous bitlines.

3. A product made by the process of for fabricating an electrically erasable nonvolatile memory having a matrix of floating gate memory cells organized in rows and columns, in which first bitlines, which are continuous and are contacted directly by a metal line, are alternated with second bitlines, which are discontinuous and are contacted through respective select transistors, comprising the steps of:

(a.) forming, in a substrate having surface semiconducting regions of a first conductivity type, a field oxide defining channel regions of said cells in the form of parallel strips oriented along a first direction, and rows of offset insular areas of said select transistors and of said contacts to said first bitlines;

(b.) forming, over said channel regions and said insular areas defined by said field oxide, a layer of gate oxide outside said matrix, and a tunnel oxide, which is thinner than said gate oxide, inside said matrix;

(c.) forming a first polysilicon layer, an interpoly dielectric thereover, a protective polysilicon layer thereover, and a layer of silicon nitride thereover;

(d.) patterning, in a stack etching step, said silicon nitride layer, said protective polysilicon layer, said interpoly dielectric, said first polysilicon layer, and said gate and tunnel and field oxides where exposed thereunder, to expose said semiconducting substrate along a plurality of alternately continuous and interrupted strips parallel to each other and oriented orthogonally to said first direction within said matrix;

(e.) implanting a heavy dose of a second-conductivity-type dopant, to form diffused bitlines in exposed areas of said semiconducting substrate;

(f.) oxidizing said exposed areas of said semiconducting substrate while diffusing said implanted dopant, said silicon nitride layer meanwhile providing an oxidation barrier where present;

(g.) depositing a conformal dielectric material, and performing a planarizing etchback to remove said silicon nitride layer and expose said protective layer of polycrystalline silicon;

(h.) removing said protective polysilicon layer and said interpoly dielectric from areas outside of said matrix;

(i.) forming a second polysilicon layer, and etching said second polysilicon layer to define the gates of transistors of said external circuits as well as of said select transistors and the control gates of said matrix of memory cells in the form of parallel strips oriented in said first direction, and performing an additional etching step, within said matrix, to remove said interpoly dielectric and said first polysilicon layer where not covered by said second polysilicon layer; and (j.) forming a plurality of contacts on each of said first bitlines, and depositing and defining parallel lines of a metallization layer to make contact thereto.

4. A product made by the process of fabricating an electrically erasable nonvolatile memory having a matrix of floating gate memory cells organized in rows and columns, in which first bitlines, which are continuous and are contacted directly by a metal line, are alternated with second bitlines, which are discontinuous and are contacted through respective select transistors, comprising the steps of:

(a.) forming, in a substrate having surface semiconducting regions of a first conductivity type, a field oxide defining channel regions of said cells in the form of parallel strips oriented along a first direction, and rows of offset insular areas of said select transistors and of said contacts to said first bitlines;

(b.) forming, over said channel regions and said insular areas defined by the field oxide, a layer of gate oxide outside said matrix, and a tunnel oxide, which is thinner than said gate oxide, inside said matrix;

(c.) forming a first polysilicon layer, and an interpoly dielectric thereover;

(d.) patterning, in a stack etching step, said interpoly dielectric, said first polysilicon layer, and said gate and tunnel and field oxides where exposed thereunder, to expose said semiconducting substrate along a plurality of alternately continuous and interrupted strips parallel to each other and oriented orthogonally to said first direction within said matrix, while leaving strips of said interpoly dielectric and first polysilicon layer within said matrix;

(e.) implanting a heavy dose of a second-conductivity-type dopant into exposed areas of said semiconducting substrate within said matrix, to form diffused bitlines;

(f.) oxidizing said exposed areas of said semiconducting substrate while diffusing said implanted dopant;

(g.) removing said interpoly dielectric and first polysilicon layer from areas outside said matrix;

(h.) forming a second polysilicon layer, and etching said second polysilicon layer to define the gates of transistors of said external circuits as well as of said select transistors and the control gates of said matrix of memory cells in the form of parallel strips oriented in said first direction, and performing an additional etching step, within said matrix, to remove said interpoly dielectric and said first polysilicon layer where not covered by said second polysilicon layer;

(i.) performing planarization by depositing and etching back a layer of conformal dielectric material, and depositing an intermediate isolation dielectric layer; and (j.) forming a plurality of contacts on each of said first bitlines and depositing and defining parallel lines of a metallization layer over each of said plurality of contacts of said continuous bitlines.

* * * * *